(12) United States Patent
Piazza et al.

(10) Patent No.: US 11,022,522 B2
(45) Date of Patent: Jun. 1, 2021

(54) PHOTONIC WAFER LEVEL TESTING SYSTEMS, DEVICES, AND METHODS OF OPERATION

(71) Applicant: STMicroelectronics S.r.l., Agrate Brianza (IT)

(72) Inventors: Marco Piazza, Milan (IT); Antonio Canciamilla, Olgiate Olona (IT); Piero Orlandi, Arcevia (IT); Luca Maggi, Garlate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 213 days.

(21) Appl. No.: 16/048,074

(22) Filed: Jul. 27, 2018

(65) Prior Publication Data

US 2020/0033228 A1    Jan. 30, 2020

(51) Int. Cl.
  *G01N 11/00*   (2006.01)
  *G01M 11/00*   (2006.01)
  *G02B 6/293*   (2006.01)
  *G01M 11/02*   (2006.01)
  *G01R 31/3185* (2006.01)
  *G01R 31/317*  (2006.01)

(52) U.S. Cl.
  CPC ...... *G01M 11/335* (2013.01); *G01M 11/0207* (2013.01); *G01R 31/31728* (2013.01); *G01R 31/318511* (2013.01); *G02B 6/2932* (2013.01)

(58) Field of Classification Search
  CPC .......... G01M 11/0207; G01M 11/335; G01R 31/31728; G01R 31/318511; G02B 6/12007; G02B 6/2932

USPC ......................................... 356/237.3; 385/14
See application file for complete search history.

(56) References Cited

U.S. PATENT DOCUMENTS

| | | | |
|---|---|---|---|
| 6,947,639 B2* | 9/2005 | Singh ................. | G02B 6/12007 385/37 |
| 8,116,624 B1* | 2/2012 | Wach ................. | H04B 10/0795 398/20 |
| 9,453,723 B1* | 9/2016 | LeMaitre ............... | G01B 11/27 |
| 2005/0094925 A1* | 5/2005 | Kish, Jr. ................ | B82Y 20/00 385/14 |
| 2012/0207428 A1* | 8/2012 | Roelkens ............. | G02B 6/2793 385/14 |
| 2016/0246005 A1* | 8/2016 | Liu ...................... | G02B 6/2726 |
| 2017/0201813 A1* | 7/2017 | Sahni ................... | H04B 10/801 |
| 2017/0205578 A1* | 7/2017 | Van Thourhout .... | G02B 6/2766 |
| 2019/0393681 A1* | 12/2019 | Fish ..................... | H01S 5/0085 |

* cited by examiner

*Primary Examiner* — Sunghee Y Gray
(74) *Attorney, Agent, or Firm* — Slater Matsil, LLP

(57) ABSTRACT

A photonic testing device includes a substrate, an optical device under test (DUT) disposed over the substrate, and an optical input circuit disposed over the substrate. The optical input circuit includes a first plurality of inputs each configured to transmit a respective optical test signal of a plurality of optical test signals. Each of the plurality of optical test signals includes a respective dominant wavelength of a plurality of dominant wavelengths. The optical input circuit further includes an output coupled to an input waveguide of the optical DUT. The output is configured to transmit a combined optical test signal comprising the plurality of optical test signals.

23 Claims, 29 Drawing Sheets

PHOTONIC WAFER LEVEL TESTING SYSTEMS, DEVICES, AND METHODS OF OPERATION

TECHNICAL FIELD

The present invention relates generally to a photonic wafer level testing system, and, in particular embodiments, to structures of photonic wafer level testing systems, photonic testing devices, and methods of operation thereof.

BACKGROUND

Photonic devices such as integrated photonic circuits may require testing to accurately characterize the response of the device. Testing may be performed at the wafer level or at the chip level. Testing performed at the wafer level, also known as wafer-scale testing, is a technique in microelectronics and affords the benefits of high throughput and low cost. In contrast, testing of photonic devices performed at the chip level, or chip-scale testing, may be used when edge coupling is necessary to ensure accuracy or when the required tests are incompatible with wafer level coupling techniques. However, chip level testing may be slow and expensive in comparison to wafer level testing. Therefore, in order to increase throughput and reduce cost, a photonic wafer level testing system that characterizes a photonic device or a photonic circuit over a broad range of wavelengths and states of polarization at the wafer level may be desirable.

SUMMARY

In accordance with an embodiment of the invention, a photonic testing device includes a substrate, an optical device under test (DUT) disposed over the substrate, and an optical input circuit disposed over the substrate. The optical input circuit includes a first plurality of inputs each configured to transmit a respective optical test signal of a plurality of optical test signals. Each of the plurality of optical test signals includes a respective dominant wavelength of a plurality of dominant wavelengths. The optical input circuit further includes an output coupled to an input waveguide of the optical DUT. The output is configured to transmit a combined optical test signal comprising the plurality of optical test signals.

In accordance with another embodiment of the invention, a method of testing a photonic device includes providing a plurality of optical test signals at respective inputs of a first plurality of inputs of an optical input circuit located on a substrate. Each of the plurality of optical test signals includes a respective dominant wavelength of a plurality of dominant wavelengths. The method further includes combining the plurality of optical test signals into a combined optical test signal at an output of the optical input circuit, transmitting the combined optical test signal through the output to an input waveguide of an optical device under test (DUT), and measuring a response of the optical DUT to the combined optical test signal. The optical DUT is located on the substrate.

In accordance with still another embodiment of the invention, a photonic testing device includes a substrate and a first optical grating coupler disposed over the substrate and configured to receive a first optical test signal comprising a first dominant wavelength and only a single type of transverse mode. The single type of transverse mode is the transverse electric (TE) mode. The photonic testing device further includes a second optical grating coupler configured to receive a second optical test signal identical to the first optical test signal, and an optical input circuit disposed over the substrate. The optical input circuit includes a first input coupled to the first optical grating coupler, a second input coupled to the second optical grating, and an output configured to be coupled to an input waveguide of an optical DUT. The output is further configured to transmit a combined optical test signal comprising exactly two types of transverse mode. The two types of transverse mode are the TE mode and the transverse magnetic (TM) mode.

BRIEF DESCRIPTION OF THE DRAWINGS

For a more complete understanding of the present invention, and the advantages thereof, reference is now made to the following descriptions taken in conjunction with the accompanying drawings, in which:

FIGS. 8A and 8B illustrate schematic diagrams of other example optical input circuits which may be used in a photonic wafer level testing system for measuring the response of an optical device under test for both TE and TM modes, wherein FIG. 8A illustrates an optical input circuit with a directional coupler and a polarization splitter-rotator, and wherein FIG. 8B illustrates an optical input circuit with a TM optical grating coupler in accordance with two embodiments of the invention;

FIG. 16A illustrates the photonic testing device before dicing and FIG. 16B illustrates the photonic testing device after dicing in accordance with an embodiment of the invention;

FIG. 17A illustrates the photonic testing device before dicing and FIG. 17B illustrates the photonic testing device after dicing in accordance with an embodiment of the invention;

FIG. 18A illustrates the photonic testing device before dicing and FIG. 18B illustrates the photonic testing device after dicing in accordance with an embodiment of the invention;

FIG. 19A illustrates the photonic testing device before dicing and FIG. 19B illustrates the photonic testing device after dicing in accordance with an embodiment of the invention;

FIG. 20A illustrates the photonic testing device before dicing and FIG. 20B illustrates the photonic testing device after dicing in accordance with an embodiment of the invention;

FIG. 21A illustrates the photonic testing device before dicing and FIG. 21B illustrates the photonic testing device after dicing in accordance with an embodiment of the invention;

FIG. 22A illustrates the photonic testing device before dicing and FIG. 22B illustrates the photonic testing device after dicing in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

Figure 1:
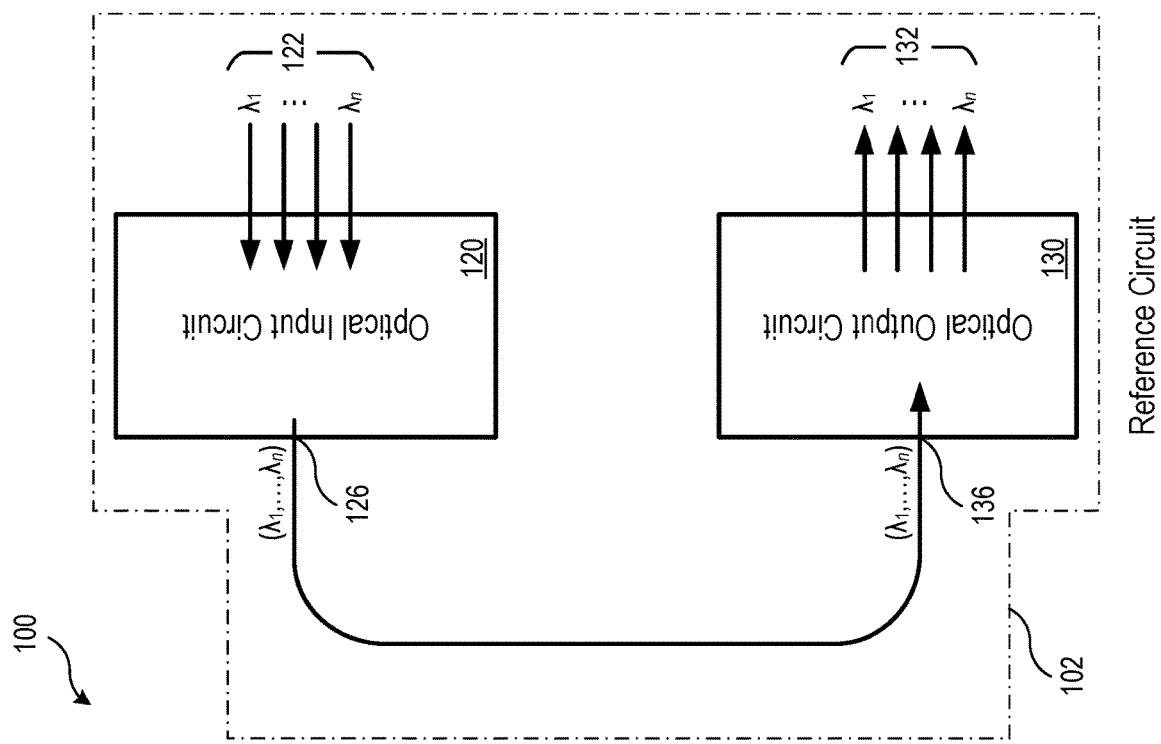
FIG. 1 illustrates a functional block diagram of an example photonic wafer level testing system for measuring the response of an optical device under test for a range of wavelengths from about $\lambda_1$ to about $\lambda_n$ in accordance with an embodiment of the invention.
Figure 1:
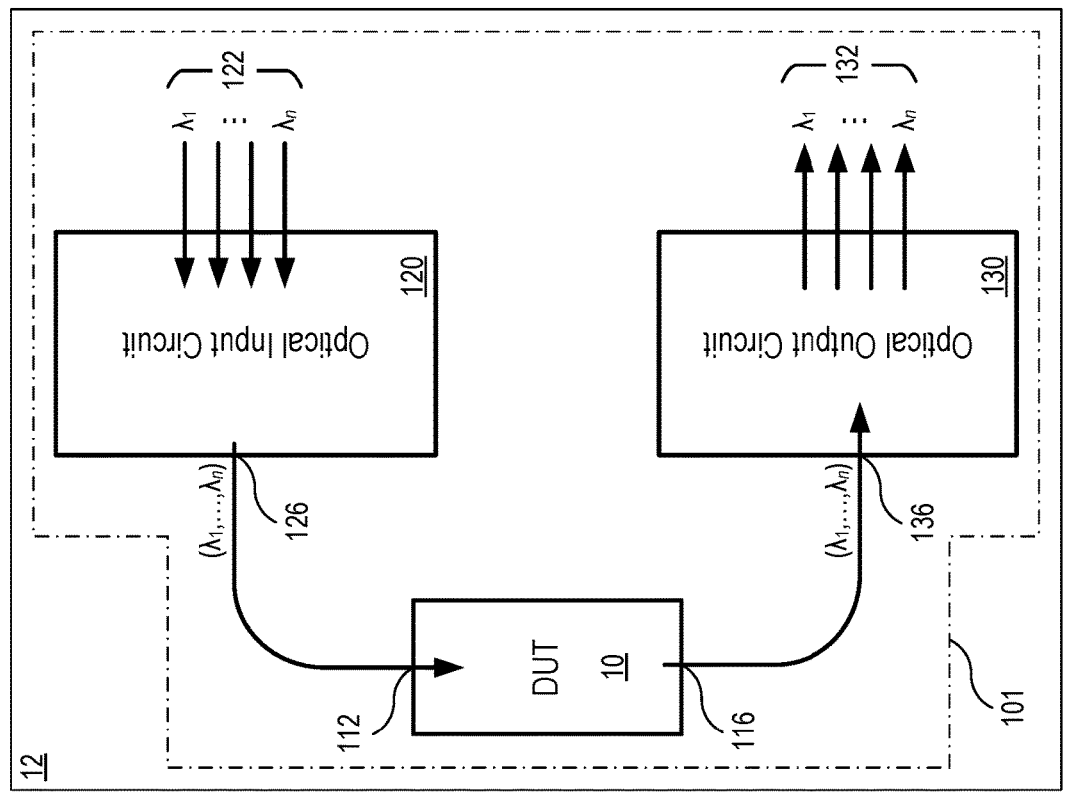

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Wafer-scale testing may be used as a technique in the microelectronics industry when high production volumes and low cost requirements are strictly related to fast and accurate screening of pass/fail devices and circuits. The same principle may be applied in the field of photonics, particularly for integrated photonic circuits. For example, a photonic wafer level testing system may include equipment to probe optical and electro-optical devices directly at the wafer level. Testing of photonic device and circuits at the wafer level may reduce or eliminate back end operations such as sawing and facet polishing that may be used to prepare samples for chip level testing with edge coupling techniques.

Photonic test signals may be introduced to an optical device under test (DUT) using various coupling techniques. In some cases, coupling techniques at the wafer level may be limited to a relatively narrow range of wavelengths and/or only a single polarization state. For example, surface coupling techniques using optical grating couplers may be limited to bandwidth of about 50 nm and to a transverse electric (TE) polarization state of the DUT. Chip level testing may be used when an optical DUT requires characterization over a wide wavelength range (for example>50 nm) and as a function of waveguide polarization state.

However, chip level testing may use edge coupling techniques to achieve wider bandwidth and polarization sensitivity. Edge coupling techniques may have limited throughput because chip loading and unloading operations account for the majority of the testing time. For example, each input and output fiber may need to be aligned independently during the loading operation. Since wafer level testing has the advantages of high throughput and low cost, it may be desirable to increase the bandwidth and polarization sensitivity of photonic wafer level testing systems so that photonic devices and circuits that require characterization over a wide range of wavelengths and/or over both TE and TM polarizations may be tested at the wafer level.

In various embodiments, a photonic wafer level testing system includes a photonic testing device. The photonic testing device includes an optical DUT and an optical input circuit disposed on a common substrate. The optical input circuit includes at least two inputs that are each configured to transmit an optical test signal. The optical input circuit further includes an output configured to transmit a combined optical test signal generated using the respective optical test signals transmitted by the at least two inputs of the optical input circuit. The combined optical test signal is transmitted to the optical DUT.

The photonic wafer level testing system may advantageously enable the optical test signals to be introduced to the inputs of the optical input circuit using wafer level coupling techniques. For example, the inputs of the optical input circuit may be coupled to a fiber block at the surface of the substrate rather than at an edge of the substrate. In some configurations, the combined test signal may be configured to increase the testable wavelength range of the photonic wafer level testing system by combining two or more wavelength ranges at the inputs of the optical input circuit. In other configurations, the combined optical test signal may be configured to increase the number of testable principal polarizations of the photonic wafer level testing system by combining a TE polarized optical test signal and a TM polarized optical test signal at the inputs of the optical circuit. In still other configurations, the combined optical test signal may be configured to increase both the testable wavelength range and the number of testable polarizations of the photonic wafer level testing system.

Embodiments provided below describe various structures and methods of operating photonic wafer level testing systems and devices, and in particular, photonic wafer level testing systems that include a combined optical test signal generated using a plurality of optical test signals. The following description describes the embodiments. Embodiment photonic wafer level testing systems for measuring the response of an optical DUT for an extended range of wavelengths are described using FIGS. 1-5 where a qualitative graph showing transmission characteristics of a reference circuit of an embodiment photonic wafer level testing system is described using FIG. 2 and where an embodiment optical input circuit of a photonic wafer level testing system is described using FIG. 4. Embodiment photonic wafer level testing systems for measuring the response of an optical DUT for both TE and TM modes are described using FIGS. 6, 8, 8A, and 8B where three embodiment optical input circuits of a photonic wafer level testing system are described using FIGS. 7, 8A, and 8B. Embodiment photonic wafer level testing systems for measuring the response of an optical DUT for an extended range of wavelengths and for both TE and TM modes are described using FIGS. 9-11 where an embodiment optical input circuit of a photonic wafer level testing system is described using FIG. 11. Several embodiment photonic wafer level testing systems which include a die area, sacrificial area, and a sawing lane are described using FIGS. 12-22B. A method of testing a photonic device is described using FIG. 23.

The following embodiments describe novel photonic wafer level testing systems capable of testing an optical DUT over an extended range of wavelengths. In some applications, it may be beneficial for a photonic wafer level testing system to be capable of taking measurements over an extended range of wavelengths. For example, a conventional system may only be capable of testing an optical DUT over a small wavelength range. If a given optical DUT operates using a wavelength range greater than the small wavelength range, then the optical DUT may be tested using conventional chip level techniques. The following embodiment photonic wafer level testing systems may advantageously be capable of testing over the full operational range of the optical DUT at the wafer level rather than the chip level.

FIG. 1 illustrates a functional block diagram of an example photonic wafer level testing system for measuring the response of an optical device under test for a range of wavelengths from about $\lambda_1$ to about $\lambda_n$ in accordance with an embodiment of the invention.

Referring to FIG. 1, a photonic wafer level testing system 100 includes a photonic testing device 101, a reference circuit 102, and a wafer substrate 12. The photonic testing device 101 is disposed on the wafer substrate 12. In various embodiments, the wafer substrate 12 comprises a semiconductor material. In some embodiments, the wafer substrate 12 comprises an insulating layer. In one embodiment, the wafer substrate 12 is a silicon-on-insulator (SOI) wafer. Alternatively, wafer substrate 12 may be a silicon wafer, silicon-on-sapphire (SOS) wafer, III-V semiconductor wafer, silicon carbide (SiC) wafer, or any other type of suitable wafer as may be apparent to one of ordinary skill in the art.

The photonic testing device 101 includes an optical input circuit 120 operatively coupled to an optical DUT 10. In one embodiment, the optical input circuit 120 and the optical DUT 10 are disposed on a same surface of the wafer substrate 12. The optical DUT 10 may be any type of optical device configured to receive optical input. For example, the optical DUT 10 may be an integrated photonic device. In various embodiments, the optical DUT 10 is a wavelength-division multiplexed (WDM) device. In some embodiments, the optical DUT 10 is a coarse WDM (CWDM) device. In several embodiments, the optical DUT 10 is an electro-optical receiver, and is a CWDM electro-optical receiver in one embodiment. Alternatively, the optical DUT 10 may be any other type of photonic device that accepts an optical input and generates a response to the optical input.

The optical input circuit 120 is configured to receive and transmit a plurality of optical test signals at a plurality of inputs 122. For example, each input of the plurality of inputs 122 may be configured to receive an optical test signal that is centered around a dominant wavelength $\lambda_i$ within a set of dominant wavelengths ($\lambda_1, \ldots, \lambda_n$). In one embodiment, each input of the plurality of inputs 122 is configured to transmit a different dominant wavelength than each other input. In other embodiments, one or more of the inputs of the plurality of inputs 122 may be configured to transmit the same dominant wavelength.

The optical input circuit 120 is configured to generate a combined optical test signal at an output 126 of the optical input circuit 120. In one embodiment, the combined optical test signal includes all of the optical test signals transmitted by the plurality of inputs 122. For example, the combined optical test signal may include the entire set of dominant wavelengths ($\lambda_1, \ldots, \lambda_n$). The combined optical test signal may be configured for measuring the response of the optical DUT 10 over a range of wavelengths including the set of dominant wavelengths ($\lambda_1, \ldots, \lambda_n$).

The output 126 of the optical input circuit 120 is operatively coupled to an input 112 of the optical DUT 10. The combined optical test signal is transmitted to the optical DUT 10 through the input 112 in order to generate a measurable response. In some embodiments, the response of the optical DUT 10 may be an optical response. Alternatively, the response of the optical DUT 10 may be electrical, mechanical, or any other suitable type of response as may be apparent to one of ordinary skill in the art. In the case of an optical response, the optical DUT 10 may include an output 116 operatively coupled to an input 136 of an optical output circuit 130. The optical output circuit 130 may be configured to separate a combined optical response signal received at the input 136 into a plurality of optical response signals transmitted by a plurality of outputs 132.

Still referring to FIG. 1, the reference circuit 102 of photonic wafer level testing system 100 may be used as a reference for the photonic testing device 101. Because of this, the photonic testing device 101 may be referred to as a measurement circuit in contrast to reference circuit 102. The reference circuit 102 includes an optical input circuit 120 operatively coupled to an optical output circuit 130. The optical input circuit 120 and the optical output circuit 130 of the reference circuit 102 are substantially similar to the optical input circuit 120 and optical output circuit 130 so that the plurality of optical response signals transmitted by the plurality of outputs 132 may be used as a reference for the photonic testing device 101. The reference circuit 102 may be disposed on wafer substrate 12 or on a separate substrate.

Each of the plurality of inputs 122 may transmit a range of wavelengths including a dominant wavelength $\lambda_i$. A subset of these transmitted wavelengths may be above a certain threshold. For example, the range of transmitted wavelengths within 10 dB may be referred to as the passband of the respective input device. The passband of an input device may represent a practically usable range of wavelengths. In other words, for the passband of an input device, the transmission strength of every wavelength in the passband may be both predictable and distinguishable over noise. Therefore, since the passband of each of the plurality of inputs 122 extends both below and above the respective dominant wavelength $\lambda_i$, the testable range of the photonic testing device 101 extends both below the dominant wavelength $\lambda_1$ and above the dominant wavelength $\lambda_n$.

As a specific example, a first input of the plurality of inputs 122 may have a dominant wavelength $\lambda_1$ as shown in FIG. 1. The first input may also have a passband width $\Delta\lambda_1$ (not shown) centered around the dominant wavelength $\lambda_1$. Therefore, in this example, the passband of the first input has a minimum wavelength of $\lambda_1 - \Delta\lambda_1/2$ and a maximum wavelength of $\lambda_1 + \Delta\lambda_1/2$. So, if each of the inputs of the plurality inputs 122 have a passband width $\Delta\lambda_i$ then the testable range of the photonic testing device 101 extends from about $\lambda_1 - \Delta\lambda_1/2$ to about $\lambda_n + \Delta\lambda_n/2$, for example. Although in this specific example the dominant wavelengths $\lambda_i$ are in the center of each passband, there is no requirement that this be the case. For other types of input device, the passband may be asymmetric or there may be multiple passbands.

Figure 2:
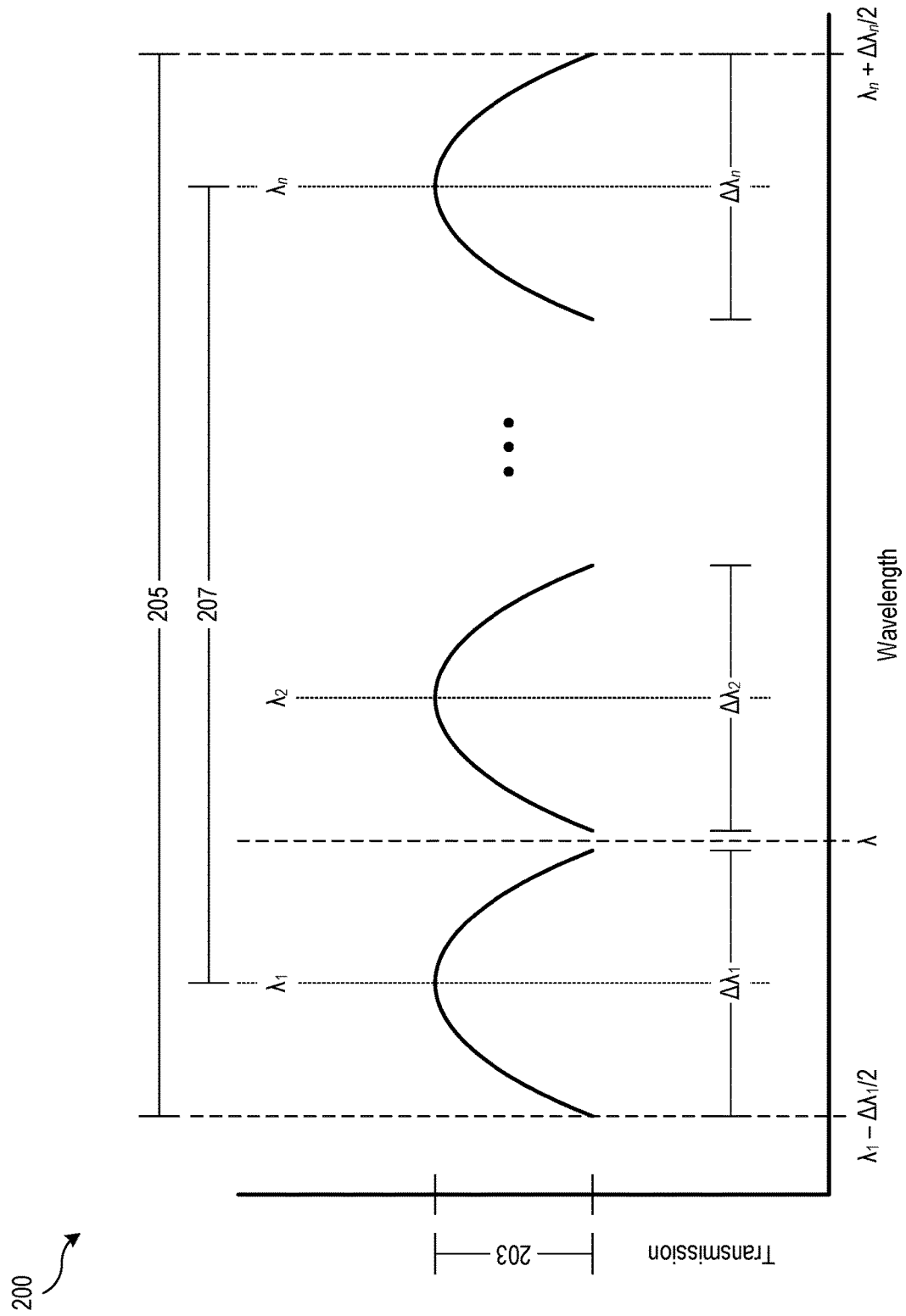
FIG. 2 illustrates a qualitative graph showing transmission as a function of input wavelength for a reference circuit of a photonic wafer level testing system in accordance with an embodiment of the invention.

FIG. 2 illustrates a qualitative graph showing transmission as a function of input wavelength for a reference circuit of a photonic wafer level testing system in accordance with an embodiment of the invention.

Referring to FIG. 2, a qualitative graph 200 of the transmission of n inputs of a plurality of inputs of an optical input circuit is shown as a function of wavelength for a range of wavelengths. The optical input circuit may be part of a photonic testing device which may in turn be part of a photonic wafer level testing system as described in various embodiments herein. For example, the plurality of inputs may be part of optical input circuit 120 as described in reference to FIG. 1. In addition, the graph may also reflect the transmission of a plurality of outputs of an optical output circuit as described in various embodiments herein, such as the optical output circuit 130 of FIG. 1, for example.

Each of the n inputs has a dominant wavelength $\lambda_i$ and passband width $\Delta\lambda_i$ such that the transmission of each of the n inputs is within a usable transmission range 203. The usable transmission range 203 may have a maximum transmission power at the dominant wavelength $\lambda_i$ and a minimum transmission power at a predetermined threshold. For example, the predetermined threshold may be defined based on the signal strength of noise in a given testing system. In various embodiments, the usable transmission range 203 is between 5 dB and 20 dB. In one embodiment, the usable transmission range 203 is about 10 dB.

The passband width $\Delta\lambda_i$ of a given input device may depend on the type of input device and the location of the passband within the electromagnetic spectrum. In various embodiments, each of the passband widths $\Delta\lambda_i$ are between 25 nm and 75 nm. In one embodiment, each of the passband widths $\Delta\lambda_i$ is about 50 nm. In various embodiments, the passband widths $\Delta\lambda_i$ are substantially equal. However, it should be noted that each passband width $\Delta\lambda_i$ may be different for each input device.

In some applications, it may be desirable to measure the response of an optical DUT over a range of wavelengths that is greater than the passband width of a single input device. The input devices may be chosen such that the combination of the plurality of inputs is configured to transmit an extended range of wavelengths. For example, as shown in graph 200, a first input device may have a dominant wavelength $\lambda_1$ and a passband width $\Delta\lambda_1$, a second input device may have a dominant wavelength $\lambda_2$ and passband width $\Delta\lambda_2$, and so on to an nth input device which may have a dominant wavelength $\lambda_n$ and passband width $\Delta\lambda_n$. In various embodiments, the dominant wavelengths $\lambda_i$ are chosen so that the passbands of the input devices do not overlap. This may be expressed mathematically as $$\begin{cases} \lambda_i + \dfrac{\Delta\lambda_i}{2} \leq \lambda_{i+1} - \dfrac{\Delta\lambda_{i+1}}{2}, & \text{for } 1 \leq i < n \\ \lambda_i - \dfrac{\Delta\lambda_i}{2} \geq \lambda_{i-1} + \dfrac{\Delta\lambda_{i-1}}{2}, & \text{for } 1 < i \leq n \end{cases}$$

Thus, as illustrated in graph 200, each input device may transmit a specific subset of a testable range 205 of wavelengths. As in the example previously discussed, graph 200 illustrates a testable range 205 extending from about $\lambda_1-\Delta\lambda_1/2$ to about $\lambda_n+\Delta\lambda_n/2$. In some cases, for a given testable range 205, it may be convenient to refer to the dominant wavelength difference 207 defined to be the difference between the maximum dominant wavelength $\lambda_n$ and the minimum dominant wavelength $\lambda_1$. For example, the dominant wavelength difference 207 may be greater than the passband of any single input device of the plurality of inputs. In some embodiments, the dominant wavelength difference 207 is greater than 25 nm. In some embodiments, the dominant wavelength difference 207 is greater than 50 nm. In various embodiments, the dominant wavelength difference 207 is between 25 nm and 75 nm. In one embodiment, the dominant wavelength difference is about 50 nm.

The dominant wavelength difference 207 may also be greater than the width of the passband that is within 1 dB of the maximum transmitted power on an input included in an optical input circuit. This, for example, may be defined as the −1 dB bandwidth of an optical grating coupler. In some embodiments, the dominant wavelength difference 207 is greater than the −1 dB bandwidth of an input included in an optical input circuit. In one embodiment, the dominant wavelength difference 207 is greater than or equal to the −1 dB bandwidth equal to about 20 nm of an input included in an optical input circuit.

In practice, the input devices may have a nonzero passband width $\Delta\lambda_i$ as shown in graph 200. As a result, the testable range 205 is greater than or equal to the dominant wavelength difference 207. In some embodiments, the testable range 205 is greater than 50 nm. In some embodiments the testable range 205 is greater than 100 nm. In various embodiments, the testable range 205 is between 50 nm and 100 nm. In one embodiment, the testable range 205 is about 75 nm. However, the extent of the testable range 205 is not limited to these ranges. Additional input devices may be included to further extend testable range 205 to any desired value.

A photonic wafer level testing system such as those described herein may be configured to test an optical DUT over one or more transmission bands of a CWDM system. For example, in various embodiments, the testable range 205 is at least the width of the original band (O-band) which begins near 1260 nm and ends near 1360 nm. One practical definition of the O-band might begin at 1263.5 nm and end at 1336.5 nm. In this case, a minimum dominant wavelength $\Delta\lambda_1$ of an input may be less than or equal to about 1270 nm while a maximum dominant wavelength $\Delta\lambda_n$ may be greater than or equal to 1330 nm. That is, $\lambda_1-\Delta\lambda_1/2$ may be less than or equal to about 1263.5 nm while $\lambda_n+\Delta\lambda_n$ may be greater than or equal to about 1336.5 nm. In this specific embodiment, the testable range 205 is greater than or equal to about 73 nm.

Other transmission bands may also be testable using the photonic wafer level testing system described herein, such as the water peak band (E-band extending from about 1360 nm to about 1460 nm), S-band (~1460 nm to ~1530 nm), C-band (~1530 nm to ~1565 nm), L-band (~1565 nm to ~1625 nm), and the like. Furthermore, embodiment photonic wafer level testing systems described herein are not limited to a specific transmission band or designation of wavelengths. Rather, any desired wavelength may be included within the testable range of a photonic wafer level testing system by incorporating appropriate input devices.

Figure 3:
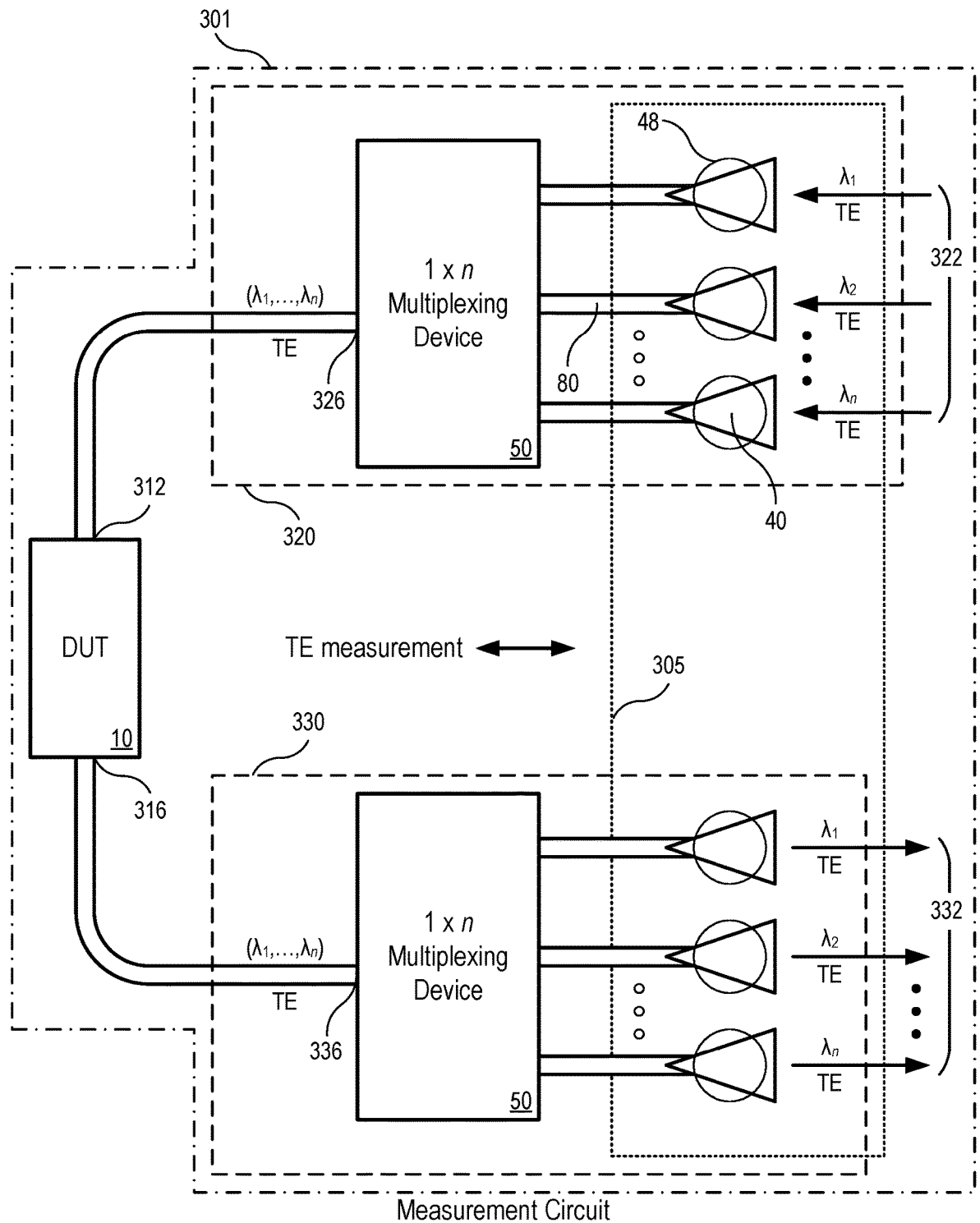
FIG. 3 illustrates a schematic diagram of an example photonic testing device which may be used in a photonic wafer level testing system for measuring the response of an optical device under test for a range of wavelengths from about $\lambda_1$ to about $\lambda_n$ where the photonic testing device includes a plurality of inputs and a plurality of outputs both implemented using optical grating couplers in accordance with an embodiment of the invention.

FIG. 3 illustrates a schematic diagram of an example photonic testing device which may be used in a photonic wafer level testing system for measuring the response of an optical device under test for a range of wavelengths from about $\lambda_1$ to about $\lambda_n$ where the photonic testing device includes a plurality of inputs and a plurality of outputs both implemented using optical grating couplers in accordance with an embodiment of the invention.

Referring to FIG. 3, a photonic testing device 301 includes an optical input circuit 320 comprising a plurality of inputs 322. The photonic testing device 301 may be a specific implementation of photonic testing device 101 as described in reference to FIG. 1, for example. Similarly labeled elements may be as previously described.

Each of the plurality of inputs 322 of optical input circuit 320 is implemented using an optical grating coupler 40. Each optical grating coupler 40 may be configured to transmit a single type of transverse polarization state. For example, an optical grating coupler 40 may be configured to transmit the TE mode and may be referred to as a TE optical grating coupler. Alternatively, an optical grating coupler 40 may be configured to transmit only the TM mode and may be referred to as a TM optical grating coupler. Each optical grating coupler 40 of the plurality of inputs 322 is optically coupled to a 1×n multiplexing device 50 that is configured to accept n optical inputs comprising n optical test signals transmitted by the plurality of inputs 322. For example, each optical grating coupler 40 may be optically coupled to the 1×n multiplexing device 50 by a waveguide 80.

In various embodiments, the waveguide 80 is an integrated waveguide. In various embodiments, the waveguide 80 is a single-mode waveguide. In other embodiments, the waveguide may be a multi-mode waveguide. Waveguide 80 may be implemented using any suitable structure as may be desired based on specific application parameters. For example, waveguide 80 may be a planar waveguide, strip waveguide, ridge waveguide, rib waveguide, diffused waveguide, buried waveguide, slot waveguide, photonic crystal waveguide, or any other suitable type of waveguide. In some embodiments, waveguide 80 is an integrated ridge waveguide and is an integrated single-mode ridge waveguide in one embodiment. In other embodiments, waveguide 80 may include a strip to rib transition. For example, a polarization splitter rotator (PSR) implemented in silicon nitride may include a strip to rib transition.

The n optical test signals may comprise respective dominant wavelengths ($\lambda_1, \ldots, \lambda_n$) as previously described. In addition, each optical grating coupler 40 may be configured to transmit only a single type of transverse mode and consequently, each of the plurality of optical test signals includes only a single type of transverse mode. In one embodiment, the single type of transverse mode is the TE mode. Alternatively, the single type of transverse mode may be the TM mode.

The 1×n multiplexing device 50 may generate a combined optical test signal at an output 326 of the optical input circuit 320. The combined optical test signal may include all of the dominant wavelengths of the plurality of optical test signals as previously described. The combined optical test signal may also include only a single type of transverse mode corresponding to the single type of transverse mode of the plurality of optical test signals.

The output 326 of the optical input circuit 320 is optically coupled to an input 312 of an optical DUT 10. The optical DUT 10 may receive the combined optical test signal at the input 312 and may be as previously described. Input 312 may be any suitable type of waveguide similar to waveguide 80 as previously described.

If the response of the optical DUT 10 is an optical response, the optical DUT 10 may optionally include an output 316 coupled to an input 336 of an optical output circuit 330. Output 316 may have similar properties and structure as input 312. A 1×n multiplexing device 50 of the optical output circuit 330 may separate a combined optical response signal input n optical response signals which may be transmitted by a plurality of outputs 332 of the optical output circuit 330. Similar to the plurality of inputs 322, each of the plurality of outputs 332 may be implemented by an optical grating coupler 40 as shown.

The optical grating couplers of the plurality of inputs 322 and the plurality of outputs 332 may be arranged such that a fiber block 305 may be used to make an external connection to photonic testing device 301. As shown, fiber block 305 may include 2n fiber connections 48. However, fiber block 305 may also extend further in any direction and include more fiber connections 48 as desired for a particular testing setup. In addition, there is no requirement that fiber block 305 extend across both the plurality of inputs 322 and the plurality of outputs 332. Rather, two or more fiber blocks 305 may be used in some embodiments.

Each optical grating coupler 40 may be configured to have a passband width $\Delta\lambda_i$ and a dominant wavelength $\lambda$ as previously described. In various embodiments, each optical grating coupler 40 comprises silicon. In one embodiment, each optical grating coupler 40 is implemented as a silicon optical grating coupler. Alternatively, other optical grating couplers may be used such as silicon nitride (SiN) optical grating couplers, and the like. It should be noted that optical grating couplers advantageously allow optical coupling to a photonic wafer level testing system in the middle regions of a wafer substrate. For example, optical connection and subsequent testing may be performed prior to any dicing or polishing processes. Moreover, optical coupling of a fiber block to an array of optical grating couplers does not require an edge of the substrate to be accessible.

Figure 4:
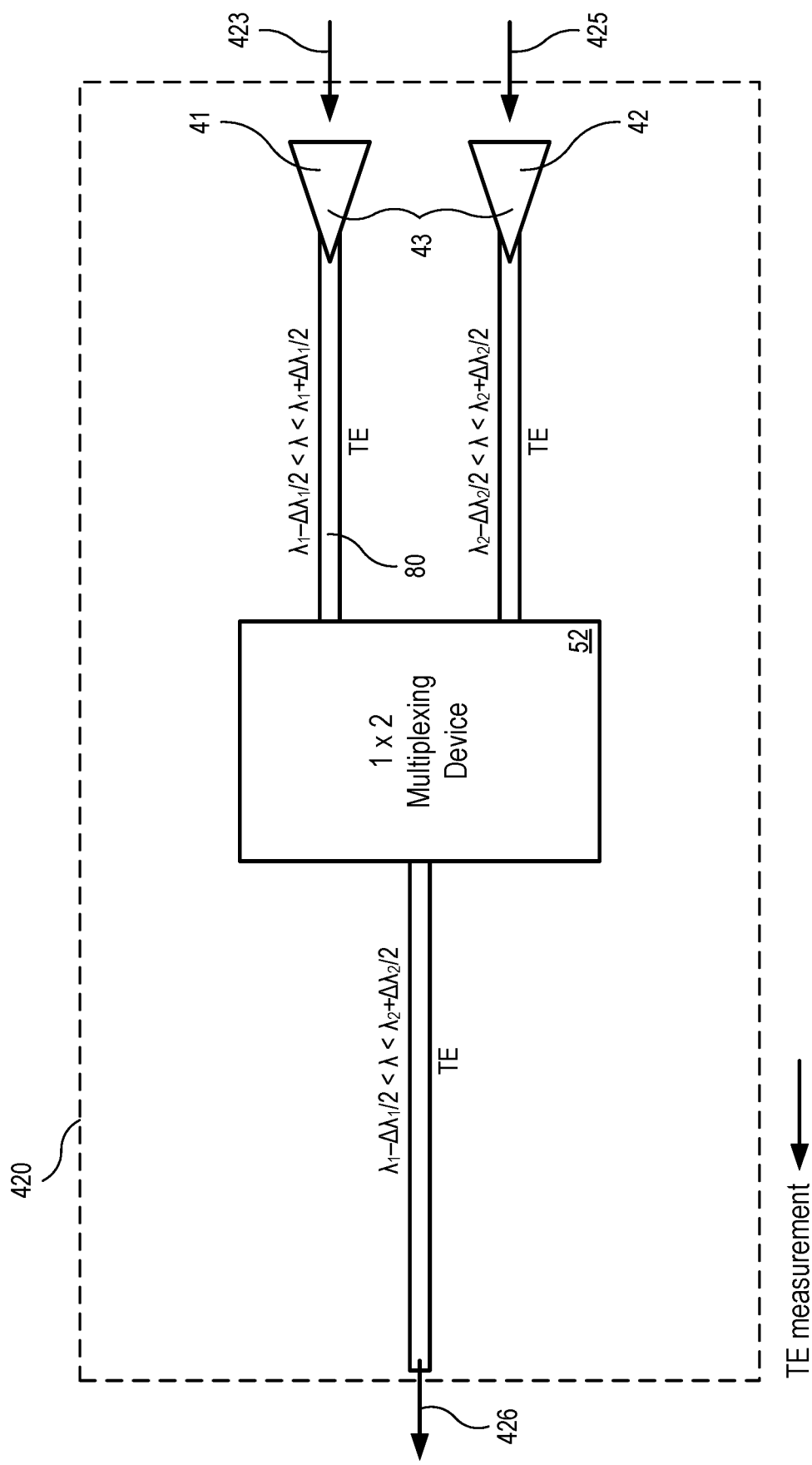
FIG. 4 illustrates a schematic diagram of an example optical input circuit which may be used in a photonic wafer level testing system for measuring the response of an optical device under test for a range of wavelengths from about $\lambda_1$ to about $\lambda_2$ where the optical input circuit includes a pair of optical grating couplers in accordance with an embodiment of the invention.

FIG. 4 illustrates a schematic diagram of an example optical input circuit which may be used in a photonic wafer level testing system for measuring the response of an optical device under test for a range of wavelengths from about $\lambda_1$ to about $\lambda_2$ where the optical input circuit includes a pair of optical grating couplers in accordance with an embodiment of the invention.

Referring to FIG. 4, an optical input circuit 420 includes a first input 423 and a second input 425 implemented as a pair of optical grating couplers 43. The optical input circuit 420 may be a specific implementation of other embodiment optical input circuits such as optical input circuit 320 where n=2 as described in reference to FIG. 3. Similarly labeled elements are as previously described.

The pair of optical grating couplers 43 comprises a first optical grating coupler 41 and a second optical grating coupler 42 configured as the first input 423 and second input 425 of optical input circuit 420 respectively. The first optical grating coupler 41 and the second optical grating coupler 42 may each be optically coupled to a 1×2 multiplexing device 52 using a respective waveguide 80.

The 1×2 multiplexing device 52 is configured to receive n=2 optical inputs comprising n=2 optical test signals transmitted through each respective waveguide 80. For example, the first optical grating coupler 41 may be configured to have a dominant wavelength $\lambda_1$ and a passband width $\Delta\lambda_1$ while the second optical grating coupler 42 may be configured to have a dominant wavelength $\lambda_2$ and a passband width $\Delta\lambda_2$. As an example, if the dominant wavelengths are in the middle of the respective passbands, then the passbands for the first optical grating coupler 41 and the second optical grating coupler 42 may be expressed using the following inequalities where $\lambda$ is an arbitrary wavelength.

$$\begin{cases} \lambda_1 - \frac{\Delta\lambda_1}{2} < \lambda < \lambda_1 + \frac{\Delta\lambda_1}{1} \\ \lambda_2 - \frac{\Delta\lambda_2}{2} < \lambda < \lambda_2 + \frac{\Delta\lambda_2}{1} \end{cases}$$

The two optical test signals are combined using 1×2 multiplexing device 52 to generate a combined optical test signal at an output 426 of the optical input circuit 420 implemented using a waveguide 80. Continuing the example above, the combined optical test signal includes both passbands of the pair of optical grating couplers 43. This can be written as $$\lambda_1 - \frac{\Delta\lambda_1}{2} < \lambda < \lambda_2 + \frac{\Delta\lambda_2}{1}$$

As can be seen from the above inequality, if the maximum wavelength ($\lambda_1+\Delta\lambda_1/2$) of the first optical grating coupler 41 is greater than or equal to the minimum wavelength ($\lambda_2-\Delta\lambda_2/2$) of the second optical grating coupler 42 then the total testable range of a photonic wafer level testing system that implements optical input circuit 420 extends from about $\lambda_1-\Delta\lambda_1/2$ to $\lambda_2+\Delta\lambda_2/2$. It is also possible for $\lambda_1+\Delta\lambda_1/2$ to be less than $\lambda_2-\Delta\lambda_2/2$ resulting in two distinct wavelength ranges that are then combined to form the combined optical test signal.

Figure 5:
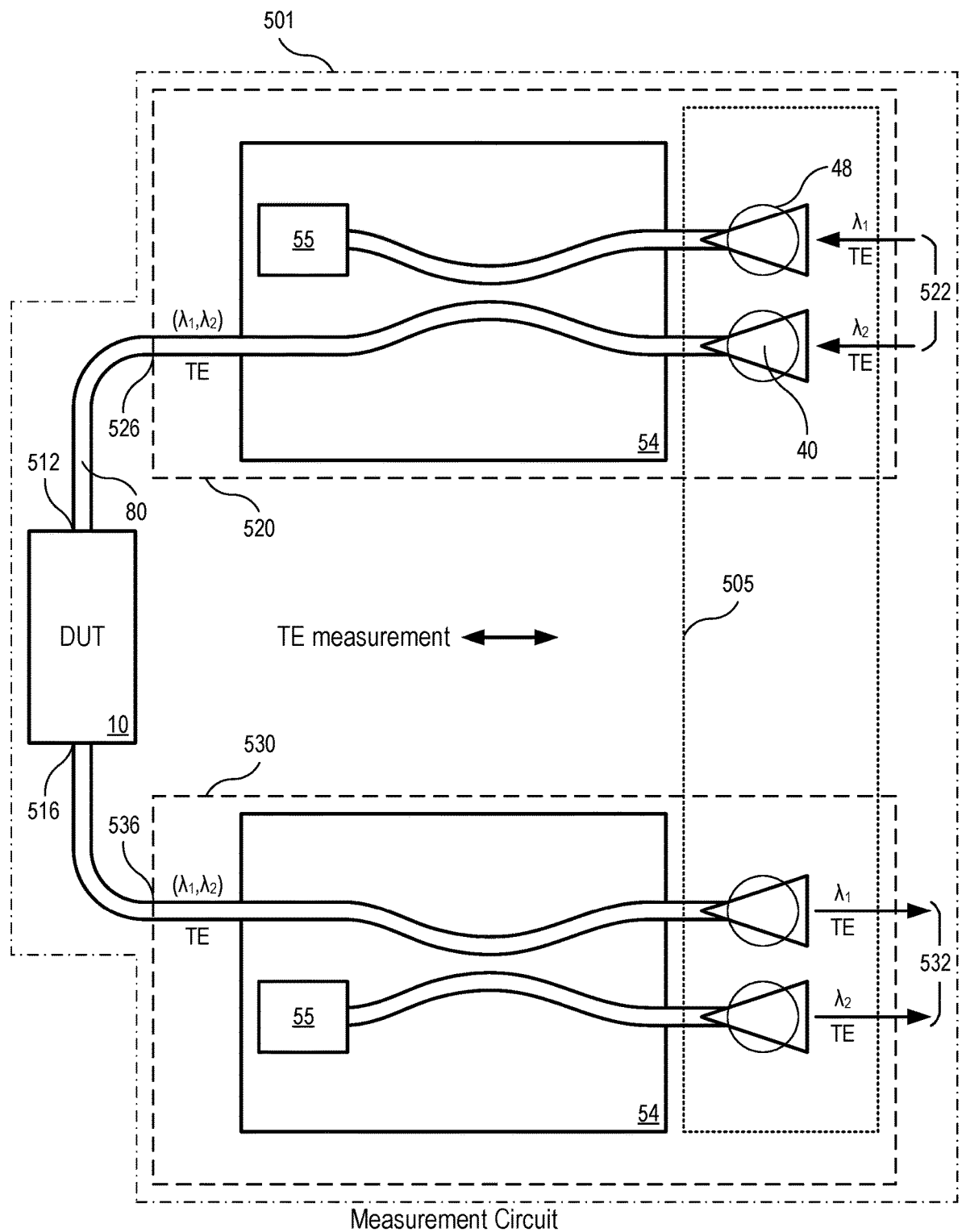
FIG. 5 illustrates a schematic diagram of an example photonic testing device which may be used in a photonic wafer level testing system for measuring the response of an optical device under test for a range of wavelengths from about $\lambda_1$ to about $\lambda_2$ where the photonic testing device includes two pairs of optical grating couplers in accordance with an embodiment of the invention.

FIG. 5 illustrates a schematic diagram of an example photonic testing device which may be used in a photonic wafer level testing system for measuring the response of an optical device under test for a range of wavelengths from about $\lambda_1$ to about $\lambda_2$ where the photonic testing device includes two pairs of optical grating couplers in accordance with an embodiment of the invention.

Referring to FIG. 5, a photonic testing device 501 includes an optical input circuit 520 comprising a plurality of inputs 522 and an optical DUT 10. The photonic testing device 501 may be a specific implementation of other embodiment photonic testing devices such as photonic testing device 301 with n=2 as described previously in reference to FIG. 3. In addition, optical input circuit 520 may be a specific implementation of optical input circuit 420 as described in reference to FIG. 4, for example. Similarly labeled elements may be as previously described.

Each of the plurality of inputs 522 is implemented using an optical grating coupler 40 which is in turn optically coupled to an optical coupler 54 using a waveguide 80. As shown, the optical input circuit 520 is configured to receive two optical test signals with dominant wavelengths $\lambda_1$ and $\lambda_2$ respectively. The two optical test signals are combined within optical coupler 54 at an output 526 of the optical input circuit 520. An optical termination 55 is included to prevent possible reflection of optical signals in the unused path of optical coupler 54.

The combined optical test signal is transmitted to optical DUT 10 through a waveguide 80 to input 512 of optical DUT 10. As before, if optical DUT 10 produces an optical response to the combined optical test signal, then photonic testing device 501 may include an optical output circuit 530 optically coupled to optical DUT 10 at an output 516. The optical output circuit 530 may receive a combined optical response signal at an input 536 which may be separated within another optical coupler 54 into two optical response signals.

As in previous embodiments, external optical coupling may be achieved using a fiber block 505 including four fiber connections 48. In embodiments that do not have an optical output circuit 550, the fiber block 505 may only have two fiber connections 48. However, the exact number of fiber connections 48 of fiber block 505 may vary as additional photonic testing devices may be present in close proximity to photonic testing device 501 on the same wafer substrate.

The following embodiments describe novel photonic wafer level testing systems capable of testing an optical DUT for both the TE mode and the TM mode. In some applications, it may be beneficial for a photonic wafer level testing system to be capable of taking measurements for multiple transverse modes. For example, a conventional system may only be capable of testing an optical DUT for the TE mode. If a given optical DUT operates using the TM mode or both the TE mode and the TM mode, then the optical DUT may be tested using conventional chip level techniques. The following embodiment photonic wafer level testing systems may advantageously be capable of testing for all transverse modes of operation of the optical DUT at the wafer level rather than the chip level.

Figure 6:
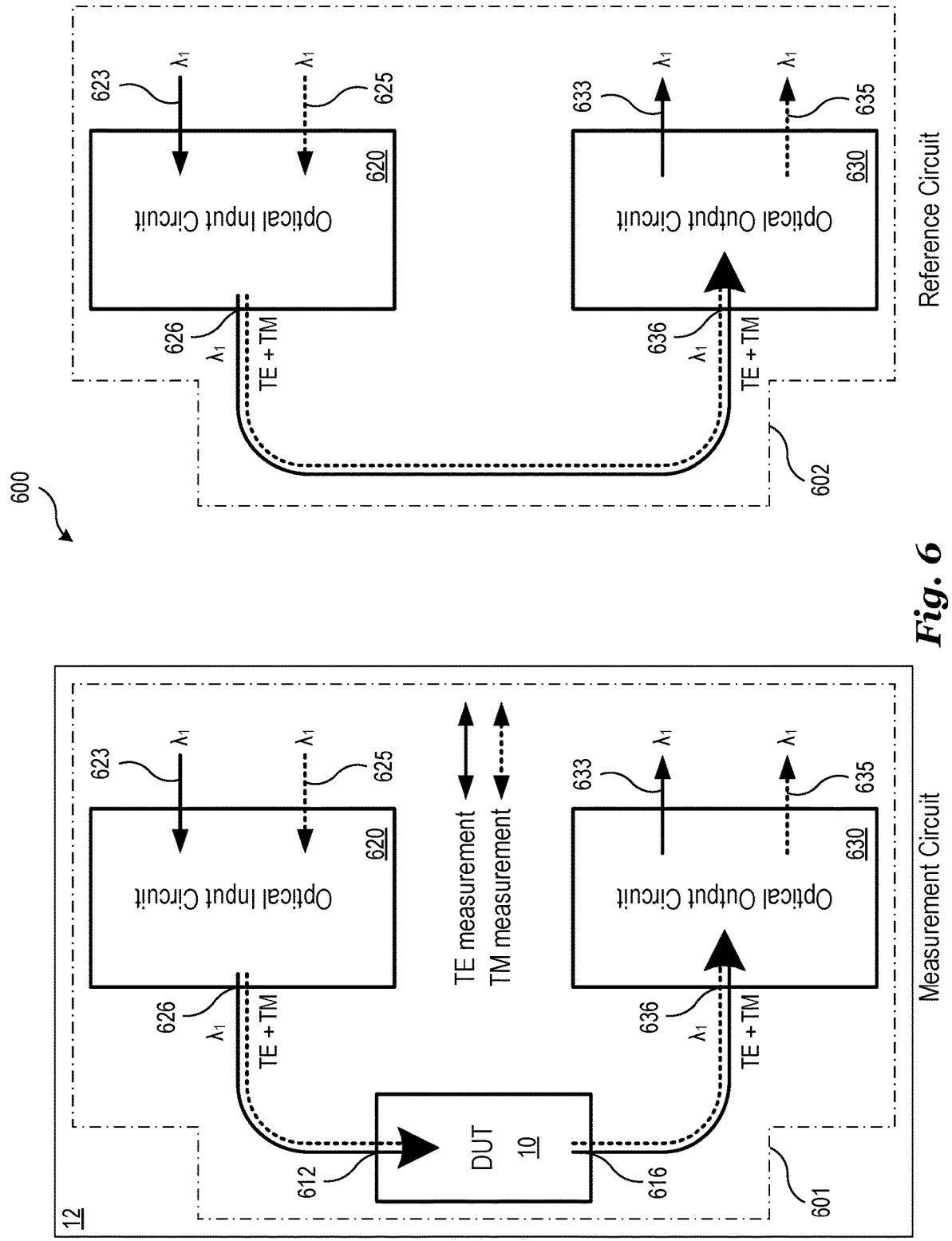
FIG. 6 illustrates a functional block diagram of an example photonic wafer level testing system for measuring the response of an optical device under test for both transverse electric (TE) and transverse magnetic (TM) modes in accordance with an embodiment of the invention.

FIG. 6 illustrates a functional block diagram of an example photonic wafer level testing system for measuring the response of an optical device under test for both TE and TM modes in accordance with an embodiment of the invention.

Referring to FIG. 6, a photonic wafer level testing system 600 includes a photonic testing device 601 for measuring a response of an optical DUT 10, a reference circuit 602, and a wafer substrate 12. The photonic testing device 601 is disposed on wafer substrate 12. Wafer substrate 12 may be as previously described. The reference circuit 602 may be substantially similar to photonic testing device 601 except for not including an optical DUT 10. In one embodiment, the reference circuit 602 is also disposed on wafer substrate 12. Alternatively, reference circuit 602 is disposed on an external substrate. Similarly labeled elements may be as previously described.

The photonic testing device 601 includes an optical input circuit 620 coupled to the optical DUT 10. In one embodiment, the optical input circuit 620 and the optical DUT 10 are disposed on a same surface of the wafer substrate 12. The optical input circuit 620 includes a first input 623 and a second input 625. In contrast to previous embodiments, the first input 623 and the second input 625 may both be configured to have a same dominant wavelength $\lambda_1$. In one embodiment, the first input 623 and the second input 625 are configured to have substantially similar optical properties.

In various embodiments, photonic testing device 601 may be used to measure a response of an optical DUT 10 for both TE and TM modes using the first input 623 and the second input 625 respectively. For example, respective optical test signals comprising only a single type of transverse mode may be received by optical input circuit 620 at the first input 623 and the second input 625. The optical input circuit 620 may be configured to convert and/or combine the two optical test signals to generate a combined optical test signal with a dominant wavelength $\lambda_1$ that includes both the TE mode and the TM mode at an output 626.

Although each of the optical test signals only comprises a single type of transverse mode, the optical test signals may include any combination of transverse mode types. In one embodiment, both the first input 623 and the second input 625 receive optical test signals comprising only the TE mode. Alternatively, the first input 623 and the second input 625 may receive optical test signals comprising a TE mode and a TM mode or both comprising TM modes.

The optical DUT 10 receives the combined optical test signal at an input 612. As before, if optical DUT 10 generates an optical response to the combined optical test signal, then photonic testing device 601 may include a output 616 optically coupled to an optical output circuit 630 at an input 636. The optical output circuit 630 may be configured to separate a combined optical response signal generated by the optical DUT 10 into two optical response signals at a first output 633 and a second output 635 respectively.

The photonic wafer level testing system 600 may advantageously allow an optical DUT 10 to be tested over both TE modes and TM modes at the wafer level. For example, the first input 623 and the second input 625 may only be able to transmit the TE mode. In this case, one of the two inputs may be configured to be converted to the TM mode within optical input circuit 620. For example, the second input 625 may receive an optical test signal with a dominant wavelength $\lambda_1$ comprising only the TE mode and optical input circuit 620 may convert the optical test signal to an identical signal comprising only the TM mode which may then be combined an optical test signal received at the first input 623 to generate the combined optical test signal.

Figure 7:
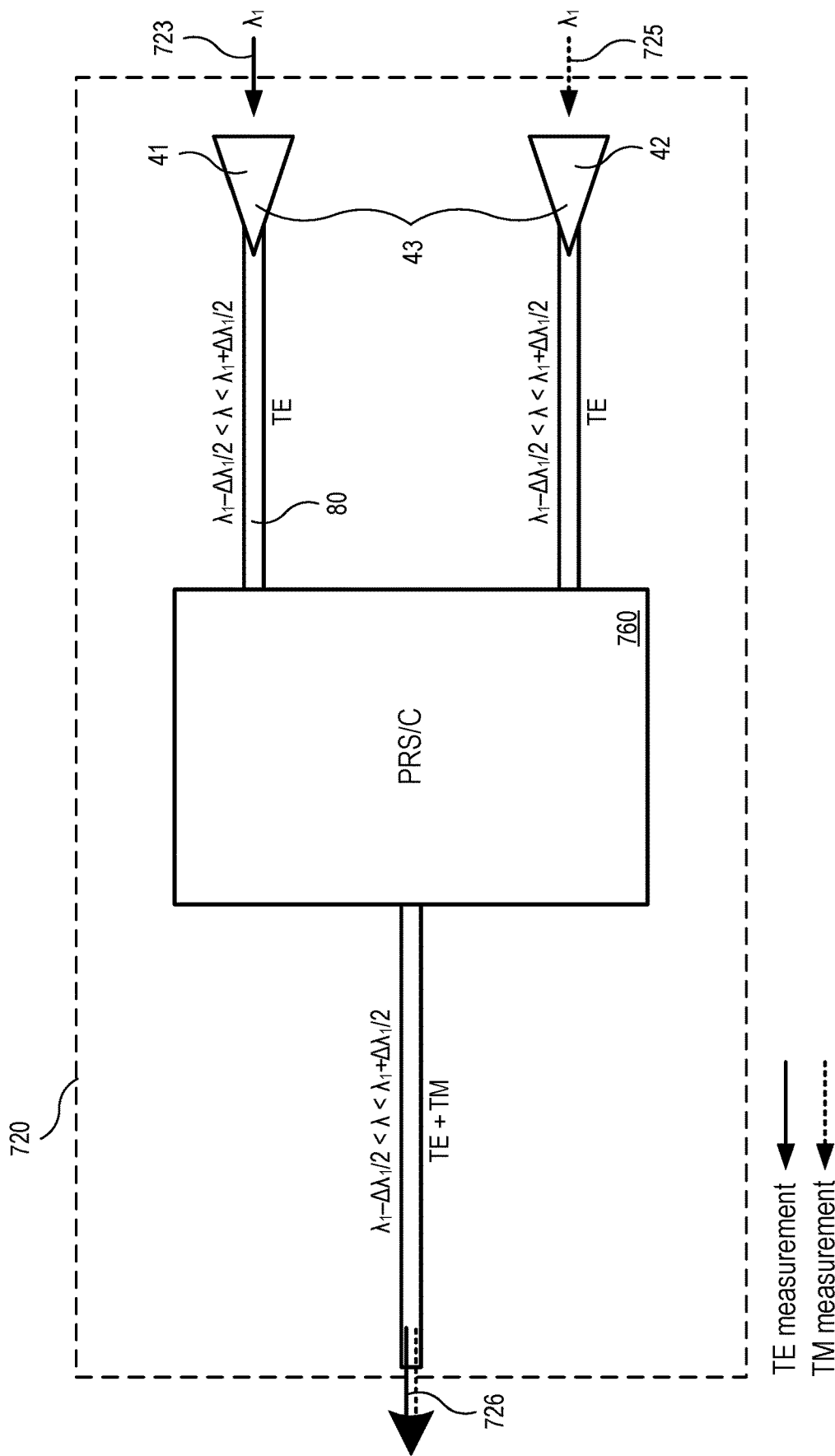
FIG. 7 illustrates a schematic diagram of an example optical input circuit which may be used in a photonic wafer level testing system for measuring the response of an optical device under test for both TE and TM modes where the optical input circuit includes a pair of optical grating couplers in accordance with an embodiment of the invention.

FIG. 7 illustrates a schematic diagram of an example optical input circuit which may be used in a photonic wafer level testing system for measuring the response of an optical device under test for both TE and TM modes where the optical input circuit includes a pair of optical grating couplers in accordance with an embodiment of the invention.

Referring to FIG. 7, an optical input circuit 720 includes a first input 723 and a second input 725 implemented as a pair of optical grating couplers 43. The optical input circuit 720 may be a specific implementation of other optical input circuits such as optical input circuit 620 as described in reference to FIG. 6, for example. Similarly labeled elements may be as previously described.

The pair of optical grating couplers 43 comprises a first optical grating coupler 41 and a second optical grating coupler 42 that are optically coupled to a polarization rotator splitter/combiner (PRS/C) 760 using respective waveguides 80 and configured as the first input 723 and the second input 725 of optical input circuit 720. In contrast to previous embodiments, the first optical grating coupler 41 and the second optical grating coupler 42 are substantially similar in various embodiments. For example, both the first optical grating coupler 41 and the second optical grating coupler 42 may be configured to transmit only a single transverse mode (TE mode) and have a dominant wavelength $\lambda_1$ as shown. Further, the first optical grating coupler 41 and the second optical grating coupler 42 may both be configured to have a bandpass width $\Delta\lambda_1$. This results in a bandwidth of $\lambda_1-\Delta\lambda_1/2<\lambda<\lambda_1+\Delta\lambda_1$ as shown.

The PRS/C 760 is configured to generate a combined optical test signal at an output 726 using respective optical test signals received by the optical input circuit 720 at the first input 723 and the second input 725 respectively. The combined optical test signal may have a bandwidth of $\lambda_1-\Delta\lambda_1/2<\lambda<\lambda_1+\Delta\lambda_1$ and include both the TE mode and the TM mode. For example, the combined optical test signal transmitted by output 726 may be a specific example of the combined optical test signal transmitted by output 626 as described in reference to FIG. 6.

As can be seen in FIG. 7, the measurement using the second input 725 may be considered a TM measurement even though the optical test signal received at the second input 725 has only the single transverse mode of the TE mode. In various embodiments, the PRS/C 760 is configured to combine the optical test signals in such a way as to apply the TE mode contribution of the optical test signal of the second input 725 toward the TM mode portion of the combined optical test signal. In one embodiment, the optical test signal transmitted by the second input 725 is converted from the TE mode to the TM mode by the PRS/C 760.

In some applications, it may be advantageous for the first optical grating coupler 41 and the second optical grating coupler 42 to be configured to have substantially identical dominant wavelengths and bandpass widths so that the combined optical test signal includes substantially identical contributions for both the TE mode and TM mode as illustrated. Alternatively, specialized applications may implement an optical input circuit having a pair of optical grating couplers with one or more differing properties as may be desired for the specific test parameters of a specific optical DUT.

Figure 8A:
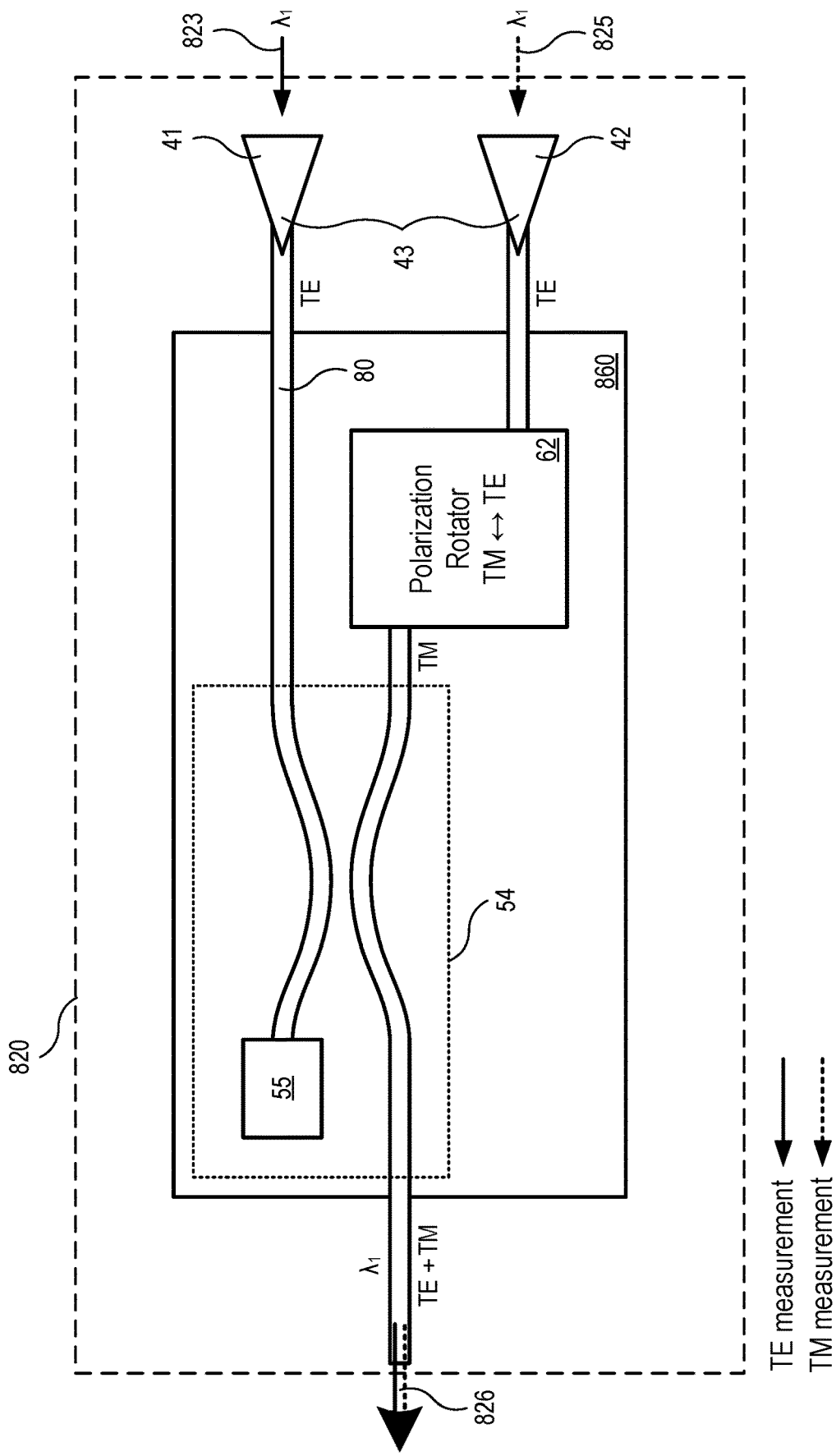
Figure 8B:
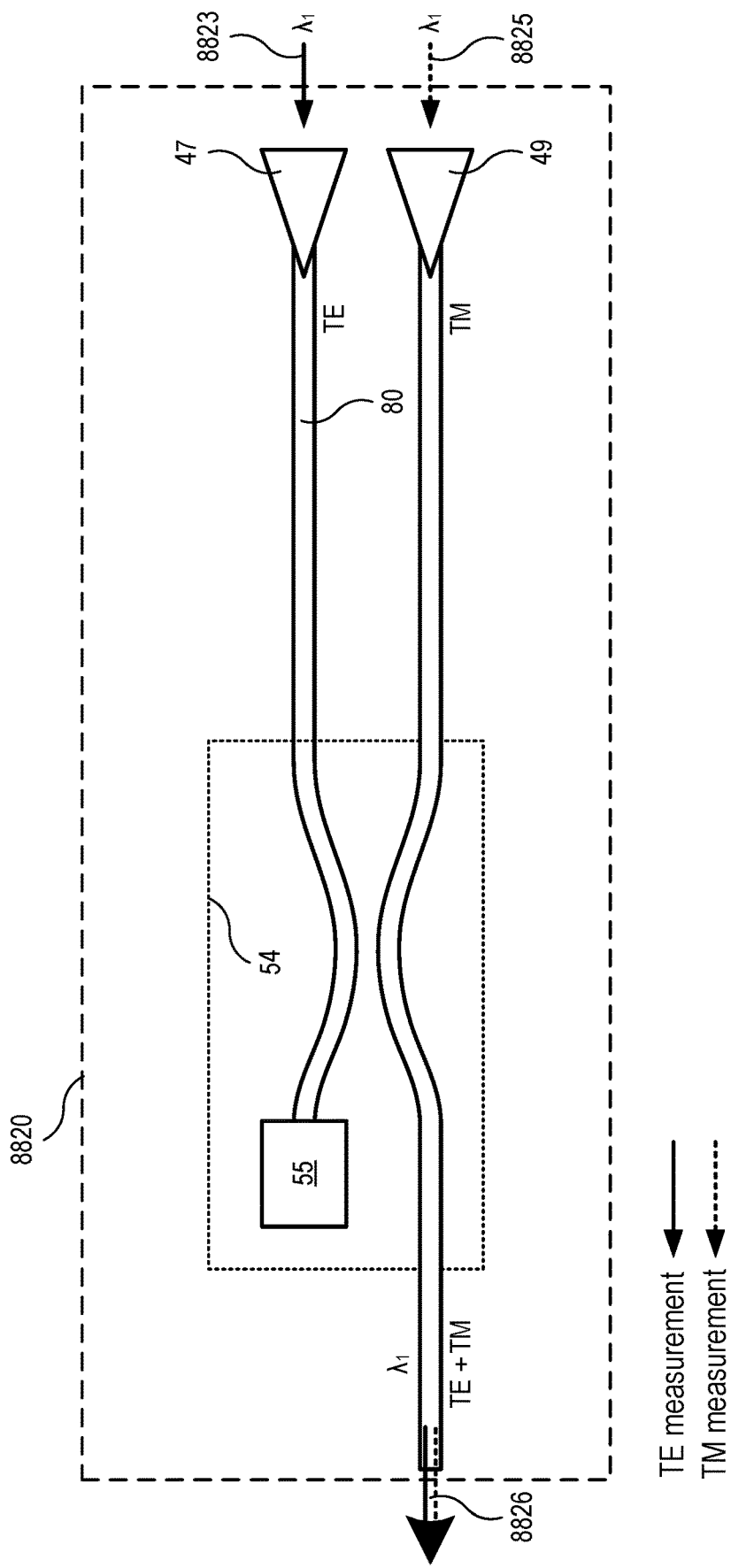

FIGS. 8A and 8B illustrate schematic diagrams of other example optical input circuits which may be used in a photonic wafer level testing system for measuring the response of an optical device under test for both TE and TM modes, wherein FIG. 8A illustrates an optical input circuit with a directional coupler and a polarization splitter-rotator, and wherein FIG. 8B illustrates an optical input circuit with a TM optical grating coupler in accordance with two embodiments of the invention.

Referring to FIG. 8A, an optical input circuit 820 includes a first input 823 and a second input 825 implemented as a pair of optical grating couplers 43. The optical input circuit 820 may be a specific implementation of other optical input circuits such as optical input circuit 720 as described in reference to FIG. 7, for example. Similarly labeled elements are as previously described.

Similar to previously embodiments, the pair of optical grating couplers 43 comprises a first optical grating coupler 41 and a second optical grating coupler 42 optically coupled to a PRS/C 860 using respective waveguides 80. The pair of optical grating couplers 43 are each configured to receive a respective optical test signal comprising a dominant wavelength $\lambda_1$ and a single type of transverse mode, such as the TE mode, for example. The PRS/C 860 is configured to generate a combined optical test signal at an output 826 of the optical input circuit 820.

The PRS/C 860 may be a specific implementation of PRS/C 760 as previously described in reference to FIG. 7, for example. PRS/C 860 includes an optical coupler 54 optically coupled to the first optical grating coupler 41. For example, optical coupler 54 is a 50/50 directional coupler in one embodiment.

The PRS/C 860 further includes a polarization rotator 62 optically coupled to the second optical grating coupler 42. The polarization rotator 62 is configured to accept an optical test signal including only a single type of transverse mode from the second optical grating coupler 42. In one embodiment, the single type of transverse mode is the TE mode. Alternatively, the single type of transverse mode is the TM mode. The polarization rotator 62 is configured to convert the single type of transverse mode to a different single type of transverse mode. For example, as shown, polarization rotator 62 converts a TE mode optical test signal into a TM mode optical test signal.

The polarization rotator 62 is optically coupled to the optical coupler 54. Optical coupler 54 is configured to combine the TE mode optical test signal from the first optical grating coupler 41 and the TM mode optical test signal from the polarization rotator 62 into a combine optical test signal including both the TE mode and the TM mode. Optical coupler 54 may also include an optical termination 55 to prevent reflection of optical signals at an unused output of the optical coupler 54.

In an alternative embodiment, both the first optical grating coupler 41 and the second optical grating coupler 42 may be configured to transmit TM mode optical test signals. In this case, polarization rotator 62 may be configured to convert the TM mode optical test signal received from the second optical grating coupler 42 into a TE mode optical test signal. The resulting combined optical test signal generated by the optical coupler 54 is then similar to other embodiments in that it includes both the TE and the TM types of transverse mode.

The following embodiments describe novel photonic wafer level testing systems capable of testing an optical DUT over an extended range of wavelengths and for both the TE mode and the TM mode. For example, if a given optical DUT operates using an extended wavelength range and uses both the TE mode and the TM mode, then the optical DUT may be tested using conventional chip level techniques. The following embodiment photonic wafer level testing systems may advantageously be capable of testing over the full operational range of wavelengths of the optical DUT as well as for all transverse modes of operation of the optical DUT at the wafer level rather than the chip level.

Referring now to FIG. 8B, an optical circuit 8820 includes a first input 8823 and a second input 8825 implemented as a TE optical grating coupler 47 and a TM optical grating coupler 49 and an output 8826. The optical input circuit 8820 may be a specific implementation of other optical input circuits such as optical input circuit 720 as described in reference to FIG. 7, for example. Similarly labeled elements are as previously described.

The optical circuit 8820 is similar to optical circuit 820 of FIG. 8A except that a polarization rotator is not needed since the second input 8825 is configured to directly transmit an optical signal comprising only the TM polarization state. For example, the TE optical grating coupler 47 may be configured to transmit an optical signal comprising only the TE polarization state while the TM optical grating coupler 49 may be configured to transmit an optical signal comprising only the TM polarization state.

It should be noted that optical grating couplers are described herein may be implemented as any type of optical grating coupler in any of the embodiments. In some cases, when a TE optical grating coupler is substituted with a TM optical grating coupler, an optical signal may no longer be rotated and the polarization rotator portion of the optical circuit may be removed.

Figure 9:
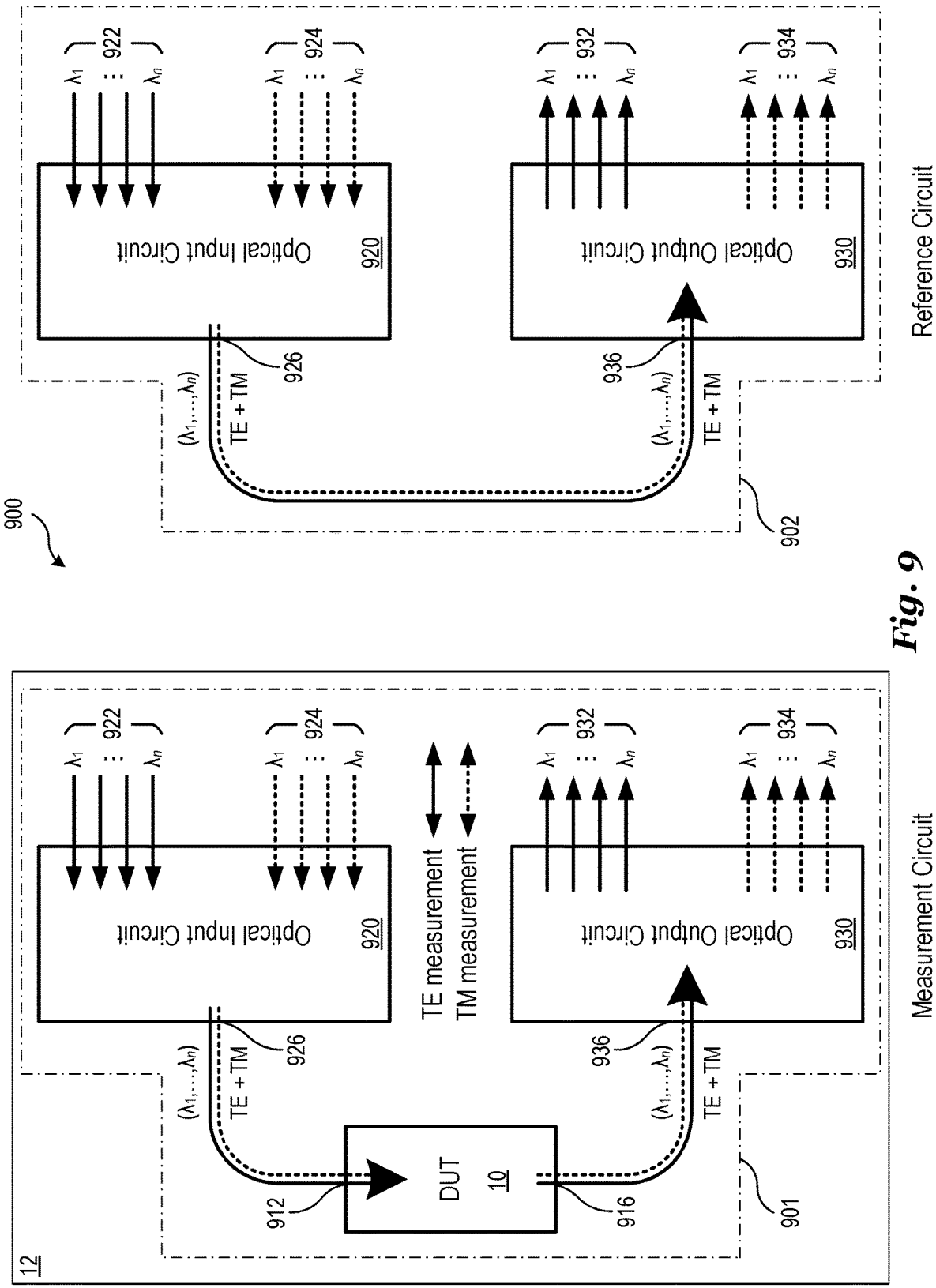
FIG. 9 illustrates a functional block diagram of an example photonic wafer level testing system for measuring the response of an optical device under test for a range of wavelengths from about $\lambda_1$ to about $\lambda_n$ and for both TE and TM modes in accordance with an embodiment of the invention.

FIG. 9 illustrates a functional block diagram of an example photonic wafer level testing system for measuring the response of an optical device under test for a range of wavelengths from about $\lambda_1$ to about $\lambda_n$ and for both TE and TM modes in accordance with an embodiment of the invention.

Referring to FIG. 9, a photonic wafer level testing system 900 includes a photonic testing device 901 for measuring a response of an optical DUT 10, a reference circuit 902, and a wafer substrate 12. The photonic testing device 901 is disposed on wafer substrate 12. Wafer substrate 12 may be as previously described. The reference circuit 902 may be substantially similar to photonic testing device 901 except for not including an optical DUT 10. In one embodiment, the reference circuit 902 is also disposed on wafer substrate 12. Alternatively, reference circuit 902 is disposed on an external substrate.

The photonic testing device 901 may be a specific implementation of other photonic testing devices. For example, photonic testing device 901 may be a specific implementation of photonic testing device 101 as described previously in reference to FIG. 1 in which the plurality of inputs 122 are separated into two groups. Alternatively, photonic testing device 901 may be a specific implementation of photonic testing device 601 as described previously in reference to FIG. 6 in which each of the first input 623 and the second input 625 are replaced by respective pluralities of inputs. Similarly labeled elements may be as previously described.

Photonic testing device 901 includes an optical input circuit 920 coupled to the optical DUT 10. In one embodiment, the optical input circuit 920 and the optical DUT 10 are disposed on a same surface of the wafer substrate 12. The optical input circuit 920 includes a first plurality of inputs 922 and a second plurality of inputs 924. In contrast to previous embodiments, the first plurality of inputs 922 and the second plurality of inputs 924 may be configured to receive substantially identical sets of optical test signals. For example, a set of n optical test signals may comprise n dominant wavelengths ($\lambda_1, \ldots, \lambda_n$) where each optical test signal includes only a single type of transverse signal. The first plurality of inputs 922 is configured to transmit the set of n optical test signals and the second plurality of inputs 924 is also configured to transmit the set of n optical test signals. In one embodiment, the first plurality of inputs 922 is configured to have substantially similar optical properties as the second plurality of inputs 924.

In various embodiments, photonic testing device 901 may be used to measure a response of an optical DUT 10 for a range of wavelengths from about $\lambda_1$ to about $\lambda_n$ and also for both TE and TM modes. For example, as illustrated, the first plurality of inputs 922 may be used to make TE measurements over the range of wavelengths while the second plurality of inputs 924 may be used to make TM measurements over the same range of wavelengths. Alternatively, the range of wavelengths of the TE mode measurements may be different than the range of wavelengths for the TM modes measurements.

The optical input circuit 920 is configured to convert and/or combine the two sets of received optical test signals in order to generate a combined optical test signal with a range of wavelengths from about $\lambda_1$ to about $\lambda_n$ that includes both the TE mode and the TM mode at an output 926.

The optical DUT 10 receives the combined optical test signal at an input 912. As before, if optical DUT 10 generates an optical response to the combined optical test signal, then photonic testing device 901 may include a output 916 optically coupled to an optical output circuit 930 at an input 936. The optical output circuit 930 may be configured to separate a combined optical response signal generated by the optical DUT 10 into two sets of optical response signals at a first plurality of outputs 932 and a second plurality of outputs 934 respectively. In various embodiments, the first plurality of outputs 932 is substantially similar to the second plurality of outputs 934. In one embodiment, each of the first plurality of inputs 922, the second plurality of inputs 924, the first plurality of outputs 932, and the second plurality of outputs 934 have substantially similar optical properties.

The photonic wafer level testing system 900 may advantageously combine extended measurement capabilities of both photonic wafer level testing system 100 and photonic wafer level testing system 600 into a single photonic wafer level testing system 900. In other words, the optical DUT 10 may be simultaneously tested over an extended range of wavelengths and over both TE modes and TM modes by photonic wafer level testing system 900 thereby incorporating the benefits afforded to photonic wafer level testing system 100 and photonic wafer level testing system 600.

Figure 10:
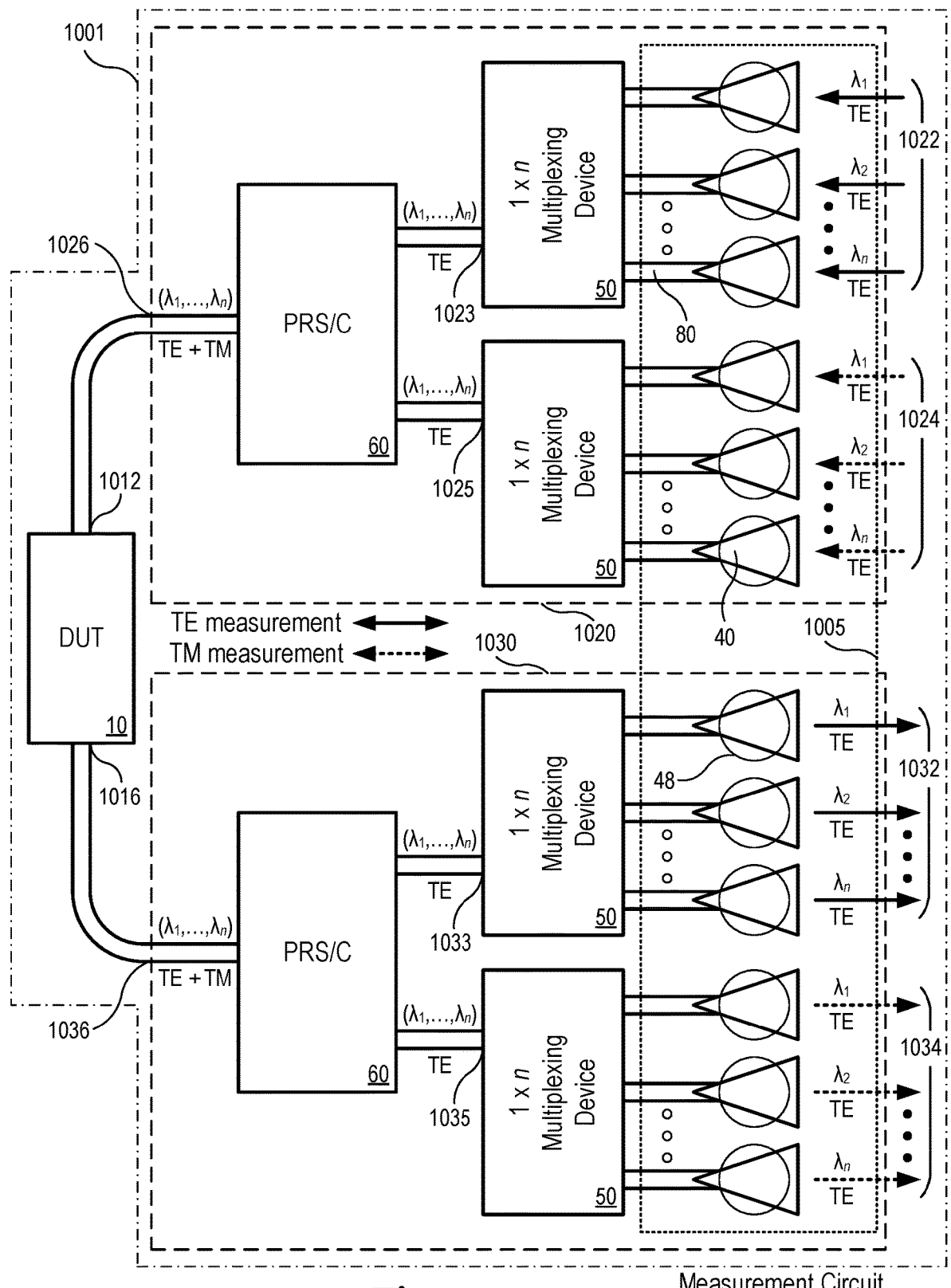
FIG. 10 illustrates a schematic diagram of an example photonic testing device which may be used in a photonic wafer level testing system for measuring the response of an optical device under test for a range of wavelengths from about $\lambda_1$ to about $\lambda_n$ and for both TE and TM modes where the photonic testing device includes a plurality of optical grating couplers in accordance with an embodiment of the invention.

FIG. 10 illustrates a schematic diagram of an example photonic testing device which may be used in a photonic wafer level testing system for measuring the response of an optical device under test for a range of wavelengths from about $\lambda_1$ to about $\lambda_n$ and for both TE and TM modes where the photonic testing device includes a plurality of optical grating couplers in accordance with an embodiment of the invention.

Referring to FIG. 10, a photonic testing device 1001 includes a optical input circuit 1020 comprising a first plurality of inputs 1022 and a second plurality of inputs 1024. The photonic testing device 1001 may be a specific implementation of other photonic testing devices such as photonic testing device 901 as previously described in reference to FIG. 9, for example. Similarly labeled elements may be as previously described.

Each of the first plurality of inputs 1022 and each of the second plurality of inputs 1024 is implemented using an optical grating coupler 40. Each optical grating coupler 40 of the first plurality of inputs 1022 is optically coupled to a corresponding 1×n multiplexing device 50 using a set of respective waveguides 80. Similarly, each optical grating coupler 40 of the second plurality of inputs 1024 is optically coupled to a corresponding 1×n multiplexing device 50 using another set of respective waveguides 80.

As with previous embodiments, the 1×n multiplexing devices 50 may be configured combine the respective plurality of optical test signals at an output. However, in contrast to previous embodiments, the 1×n multiplexing device 50 corresponding to the first plurality of inputs 1022 is configured to generate a first intermediate combined optical test signal at an output 1023 while the 1×n multiplexing device 50 corresponding to the second plurality of inputs 1024 is configured to generate a second intermediate combined optical test signal at an output 1025. The first and second intermediate combined optical test signals may each comprise the full set of dominant wavelengths ($\lambda_1, \ldots, \lambda_n$). Alternatively, the range of wavelengths transmitted by the first plurality of inputs 1022 may differ from the range of wavelengths transmitted by the second plurality of inputs 1024.

The intermediate combined optical test signals generated at output 1023 and output 1025 may each include only a single type of transverse mode. In one embodiment, the single type of transverse mode is the TE mode as illustrated. In various embodiments, the first intermediate combined optical test signal and the second intermediate combined optical test signal are substantially identical. Alternatively, the first and second intermediate combined optical test signals may differ.

Output 1023 and output 1025 are optically coupled to a PRS/C 60 which is as previously described. That is, PRS/C 60 is configured to combine the first intermediate combined optical test signal and the second intermediate combined optical test signal into a combined optical test signal at and output 1026 of the optical input circuit 1020. As before, the combined optical test signal includes both the TE mode and the TM mode. In addition, by virtue of the range of wavelengths included in the first and second intermediate combined optical test signals, the combined optical test signal generated at output 1026 also includes the full range of dominant wavelengths ($\lambda_1, \ldots, \lambda_n$).

The output 1026 of optical input circuit 1020 is optically coupled to an input 1012 of the optical DUT 10. As illustrated, input 1012 may be any type of suitable waveguide similar to waveguide 80 as previously described. Similar to previous embodiments, if the optical DUT 10 generates an optical response, an optical output circuit 1030 which may be substantially similar to the optical input circuit 1020 may be optionally included. An input 1036 of the optical output circuit 1030 may be optically coupled to an output 1016 of the optical DUT 10. The optical output circuit 1030 may include a PRS/C 60 configured to separate a combined optical response signal into first and second intermediate combined optical response signals at an input 1033 and an input 1035 of corresponding 1×n multiplexing devices 50 of the optical output circuit 1030 respectively. The first and second intermediate signals may then be further separated into a plurality of optical response signals at a first plurality of outputs 1032 and a second plurality of outputs 1034.

As in previous embodiments, a fiber block 1005 may be used to make eternal connection to photonic testing device 1001. Fiber block 1005 may include 411 fiber connections 48 as illustrated. In other embodiments, fiber block 1005 may include any number of fiber connections 48 as desired.

Figure 11:
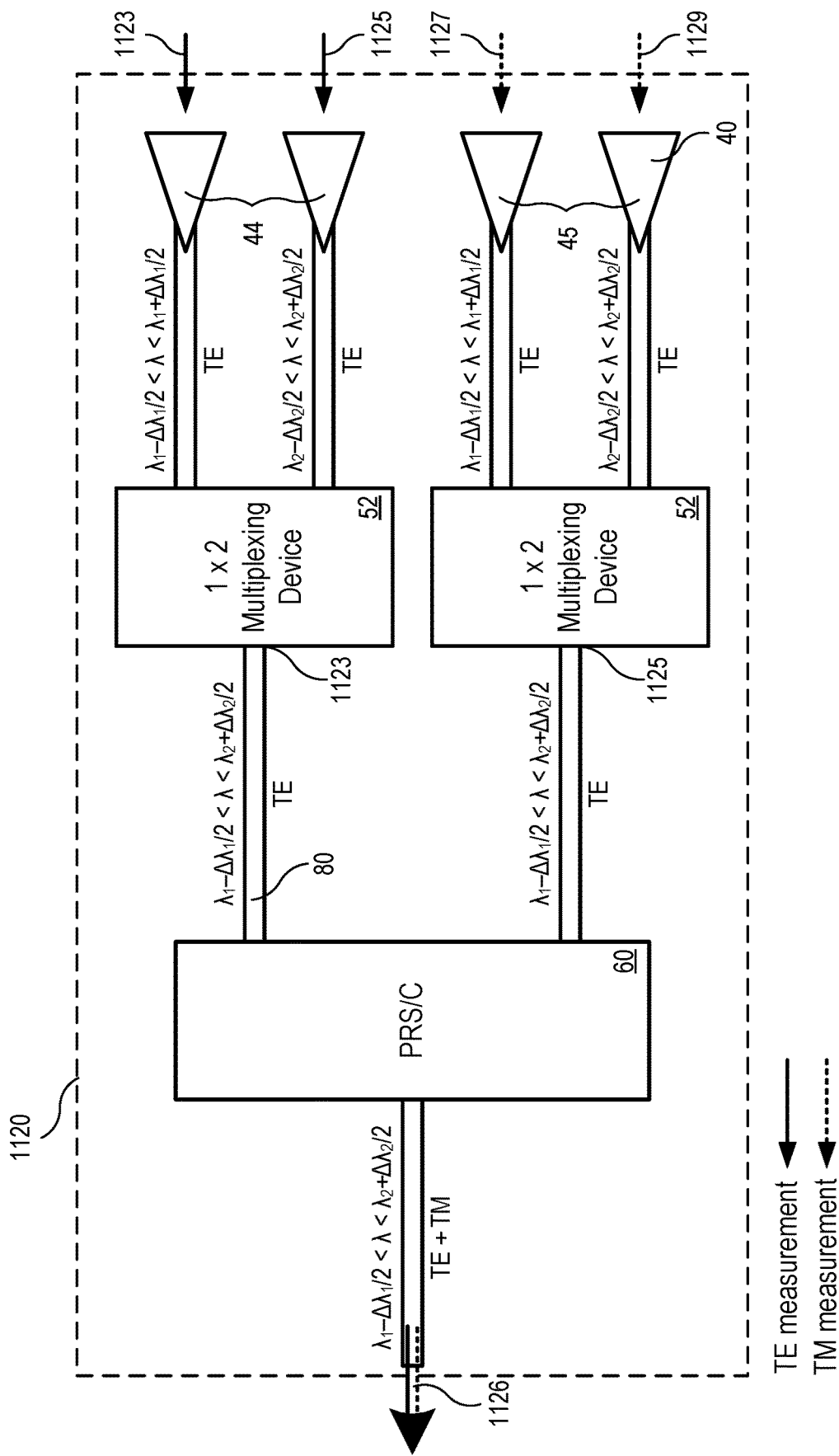
FIG. 11 illustrates schematic diagram of an example optical input circuit which may be used in a photonic wafer level testing system for measuring the response of an optical device under test for a range of wavelengths from about $\lambda_1$ to about $\lambda_n$ and for both TE and TM modes where the optical input circuit includes two pairs of optical grating couplers in accordance with an embodiment of the invention.

FIG. 11 illustrates schematic diagram of an example optical input circuit which may be used in a photonic wafer level testing system for measuring the response of an optical device under test for a range of wavelengths from about $\lambda_1$ to about $\lambda_n$ and for both TE and TM modes where the optical input circuit includes two pairs of optical grating couplers in accordance with an embodiment of the invention.

Referring to FIG. 11, an optical input circuit 1120 includes a first input 1123 and a second input 1125 implemented as a first pair of optical grating couplers 44. The optical input circuit 1120 further includes a third input 1127 and fourth input 1129 implemented as a second pair of optical grating couplers 45. Each optical grating coupler 40 of the first pair of optical grating couplers 44 are coupled to a corresponding 1×2 multiplexing device 52. Similarly, each optical grating coupler 40 of the second pair of optical grating couplers 45 is optically coupled to another corresponding 1×2 multiplexing device 52. The optical input circuit 1120 may be a specific implementation of other optical input circuits such as optical input circuit 1020 as described in reference to FIG. 10, for example. Similarly labeled elements may be as previously described.

The pairs of optical grating couplers may have a substantially similar structure such that both the first pair of optical grating couplers 44 and the second pair of optical grating couplers 45 are configured to have substantially identical passbands and comprise only a single type of transverse mode. In one embodiment, the single type of transverse mode is the TE mode, as illustrated.

As in previous embodiments, each of the 1×2 multiplexing devices is configured to combine a pair of optical test signals. The 1×2 multiplexing device 52 corresponding to the first pair of optical grating couplers 44 generates a first intermediate combined optical test signal at a first output 1123 while the 1×2 multiplexing device 52 corresponding to the second pair of optical grating couplers 45 generates a second intermediate combined optical test signal at a second output 1125. As shown, both the first and second intermediate combined optical test signals comprise a wavelength range ($\lambda_1-\Delta\lambda_1/2 < \lambda < \lambda_2+\Delta\lambda_2/2$) that includes both of the wavelength ranges of the optical test signals at the inputs. A PRS/C 60 is optically coupled to the first output 1123 and the second output 1125 generates a combined optical test signal at an output 1126 of the optical input circuit 1120 using the first and second intermediate combined optical test signals. The combined optical test signal includes the full wavelength range of $\lambda_1-\Delta\lambda_1/2 < \lambda < \lambda_2+\Delta\lambda_2/2$ as well as both the TE mode and the TM mode.

The following embodiments describe specific implementations of embodiment photonic testing devices disposed on a single wafer substrate such that the optical DUT is in a die area of the single wafer substrate and various optical testing components such as an optical input circuit are in a sacrificial area of the single wafer substrate. These embodiment photonic testing devices may advantageously allow an optical DUT to be tested at the wafer level before a dicing process using an optical input while also using the same optical input as a final coupling system at the die level after the dicing process.

Figure 12:
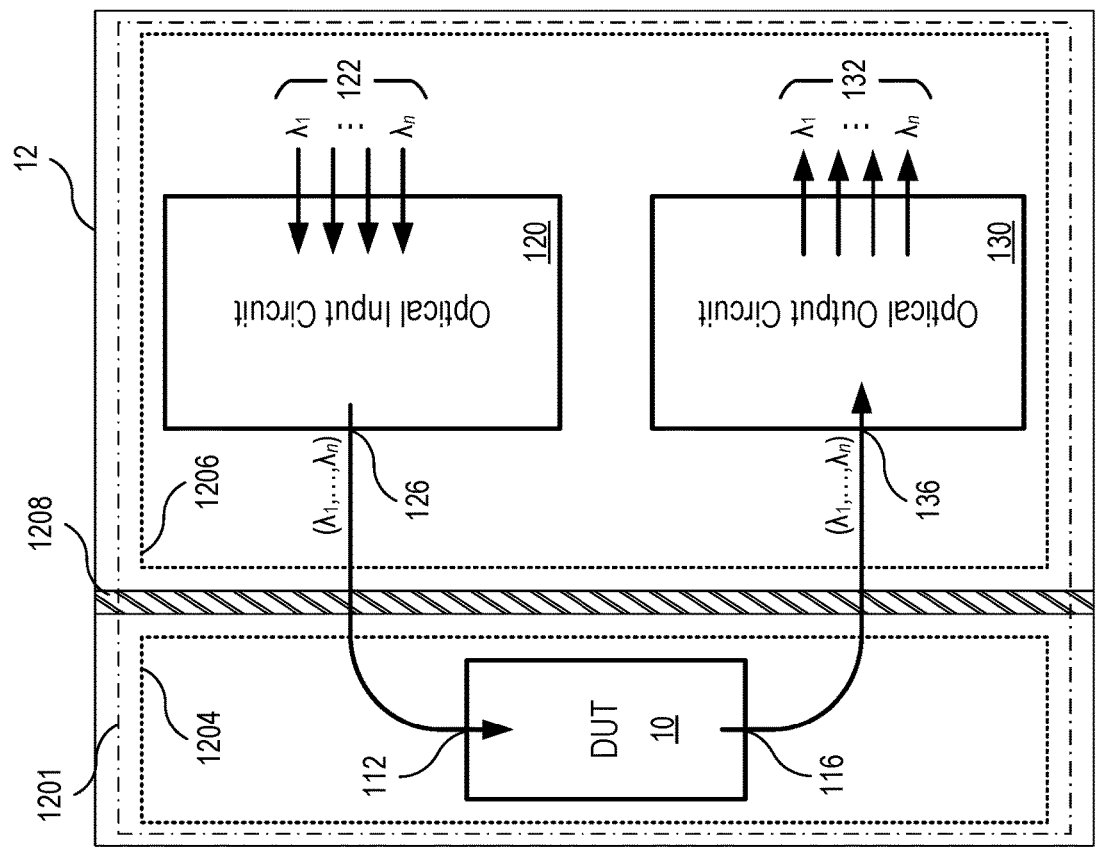
FIG. 12 illustrates a schematic diagram of an example photonic testing device which may be used in a photonic wafer level testing system for measuring the response of an optical device under test for a range of wavelengths from about $\lambda_1$ to about $\lambda_n$ where the photonic testing device includes a die area, a sacrificial area, and a sawing lane in accordance with an embodiment of the invention.

FIG. 12 illustrates a schematic diagram of an example photonic testing device which may be used in a photonic wafer level testing system for measuring the response of an optical device under test for a range of wavelengths from about $\lambda_1$ to about $\lambda_n$ where the photonic testing device includes a die area, a sacrificial area, and a sawing lane in accordance with an embodiment of the invention.

Referring to FIG. 12, a photonic testing device 1201 is disposed on a single wafer substrate 12 and includes a die area 1204, a sacrificial area 1206, and a sawing lane 1208. Photonic testing device 1201 may be a specific implementation of other photonic testing devices such as photonic testing device 101 as previously described in reference to FIG. 1, for example. Similarly labeled elements may be as previously described.

The die area 1204 includes the optical DUT 10 and is not discarded after dicing. The die area 1204 may also be referred to as a chip area, die region, chip, and the like. The sacrificial area 1206 includes an optical input circuit 120 and an optical output circuit 130 and is discarded after dicing. The sawing lane 1208 is path taken during the dicing process to separate die area 1204 from sacrificial area 1206. The region that is removed by the dicing process may be referred to as a kerf region if material is removed during the dicing process. However, some dicing processes may remove little to no material.

The photonic testing device 1201 may advantageously enable testing of the optical DUT 10 at the wafer level prior to any dicing steps. For example, all connections to inputs and outputs of photonic testing device 1201 may be made without edge connections and without facet polishing steps. In various embodiments, fiber blocks including fiber connections may be used to make optical connections to an interior region of a top surface of the wafer substrate. After testing, dicing may be performed to create chips containing the optical DUT 10 while the sacrificial area 1206 and any excess material generated in the sawing lane 1208 during the dicing process are discarded.

Figure 13:
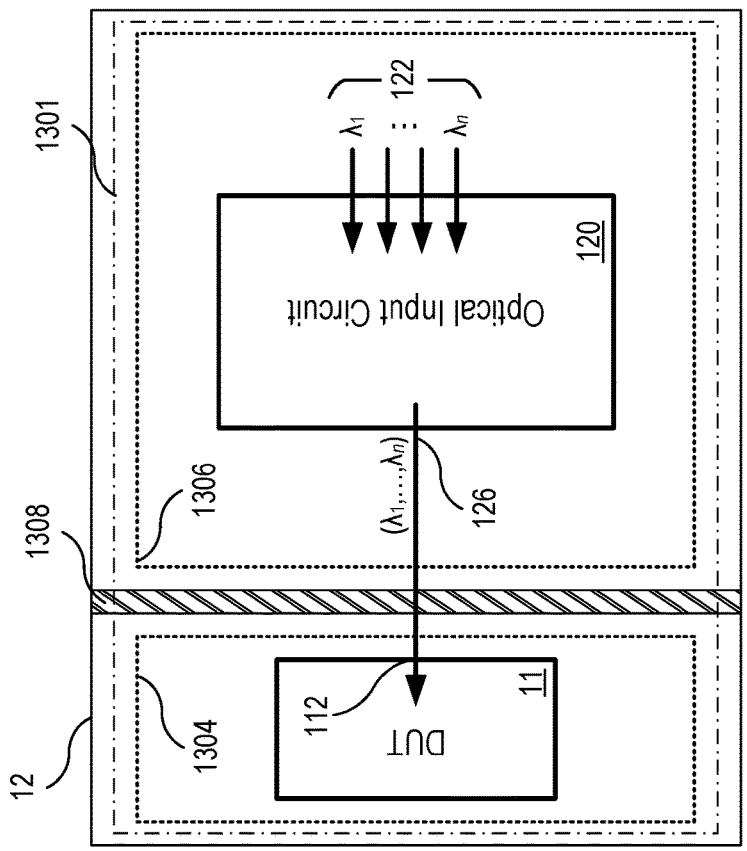
FIG. 13 illustrates a schematic diagram of another example photonic testing device which may be used in a photonic wafer level testing system for measuring the response of an optical device under test for a range of wavelengths from about $\lambda_1$ to about $\lambda_n$ where the photonic testing device includes a die area, a sacrificial area, and a sawing lane in accordance with an embodiment of the invention.

FIG. 13 illustrates a schematic diagram of another example photonic testing device which may be used in a photonic wafer level testing system for measuring the response of an optical device under test for a range of wavelengths from about $\lambda_1$ to about $\lambda_n$ where the photonic testing device includes a die area, a sacrificial area, and a sawing lane in accordance with an embodiment of the invention.

Referring to FIG. 13, a photonic testing device 1301 is disposed on a single wafer substrate 12 and includes a die area 1304, a sacrificial area 1306, and a sawing lane 1308. Photonic testing device 1301 is similar to photonic testing device 1201 except that photonic testing device 1301 includes an optical DUT 11 that receives an optical test signal and generates a non-optical response. For example, optical DUT 11 generates an electrical response in one embodiment. The photonic testing device 1301 may be a specific implementation of other photonic testing devices such as photonic testing device 101 as described in reference to FIG. 1, for example. Similarly labeled elements may be as previously described.

Figure 14:
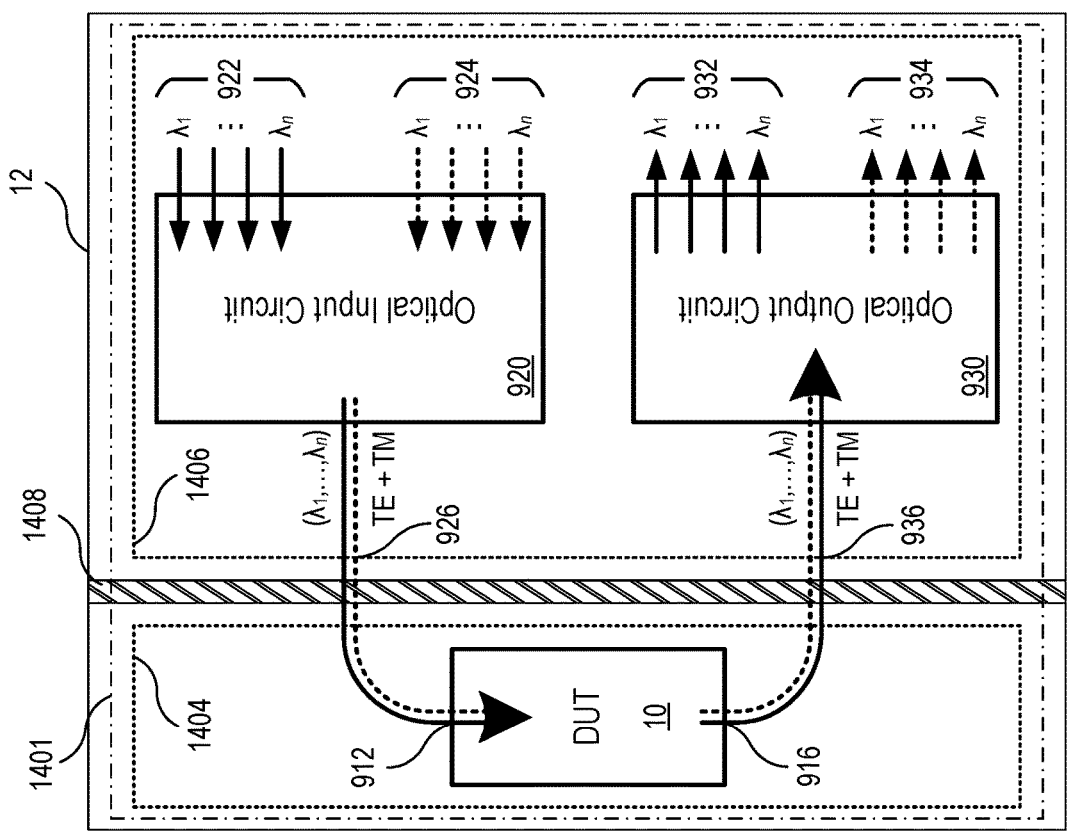
FIG. 14 illustrates a schematic diagram of an example photonic testing device which may be used in a photonic wafer level testing system for measuring the response of an optical device under test for a range of wavelengths from about $\lambda_1$ to about $\lambda_n$ and for both TE and TM modes where the photonic testing device includes a die area, a sacrificial area, and a sawing lane in accordance with an embodiment of the invention.

FIG. 14 illustrates a schematic diagram of an example photonic testing device which may be used in a photonic wafer level testing system for measuring the response of an optical device under test for a range of wavelengths from about $\lambda_1$ to about $\lambda_n$ and for both TE and TM modes where the photonic testing device includes a die area, a sacrificial area, and a sawing lane in accordance with an embodiment of the invention.

Referring to FIG. 14, a photonic testing device 1401 is disposed in a single wafer substrate 12 and includes a die area 1404, a sacrificial area 1406, and a sawing lane 1408. Photonic testing device 1401 may be a specific implementation of other photonic testing devices such as photonic testing device 900 as described in reference to FIG. 9, for example. Similarly labeled elements may be as previously described.

Figure 15:
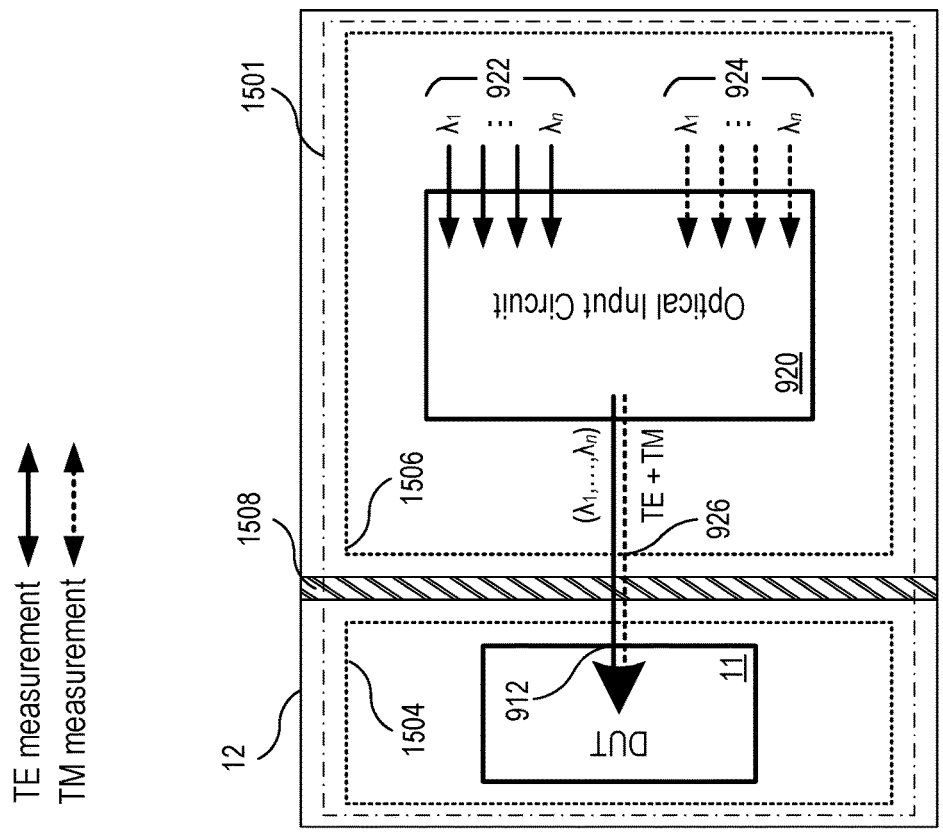
FIG. 15 illustrates a schematic diagram of another example photonic testing device which may be used in a photonic wafer level testing system for measuring the response of an optical device under test for a range of wavelengths from about $\lambda_1$ to about $\lambda_n$ and for both TE and TM modes where the photonic testing device includes a die area, a sacrificial area, and a sawing lane in accordance with an embodiment of the invention.

FIG. 15 illustrates a schematic diagram of another example photonic testing device which may be used in a photonic wafer level testing system for measuring the response of an optical device under test for a range of wavelengths from about $\lambda_1$ to about $\lambda_n$ and for both TE and TM modes where the photonic testing device includes a die area, a sacrificial area, and a sawing lane in accordance with an embodiment of the invention.

Referring to FIG. 15, a photonic testing device 1501 is disposed in a single wafer substrate 12 and includes a die area 1504, a sacrificial area 1506, and a sawing lane 1508. Photonic testing device 1501 is similar to photonic testing device 1401 except that photonic testing device 1501 includes an optical DUT 11, which is as previously described. The photonic testing device 1501 may be a specific implementation of other photonic testing devices such as photonic testing device 900 as described in reference to FIG. 9, for example. Similarly labeled elements may be as previously described.

Figure 16A:
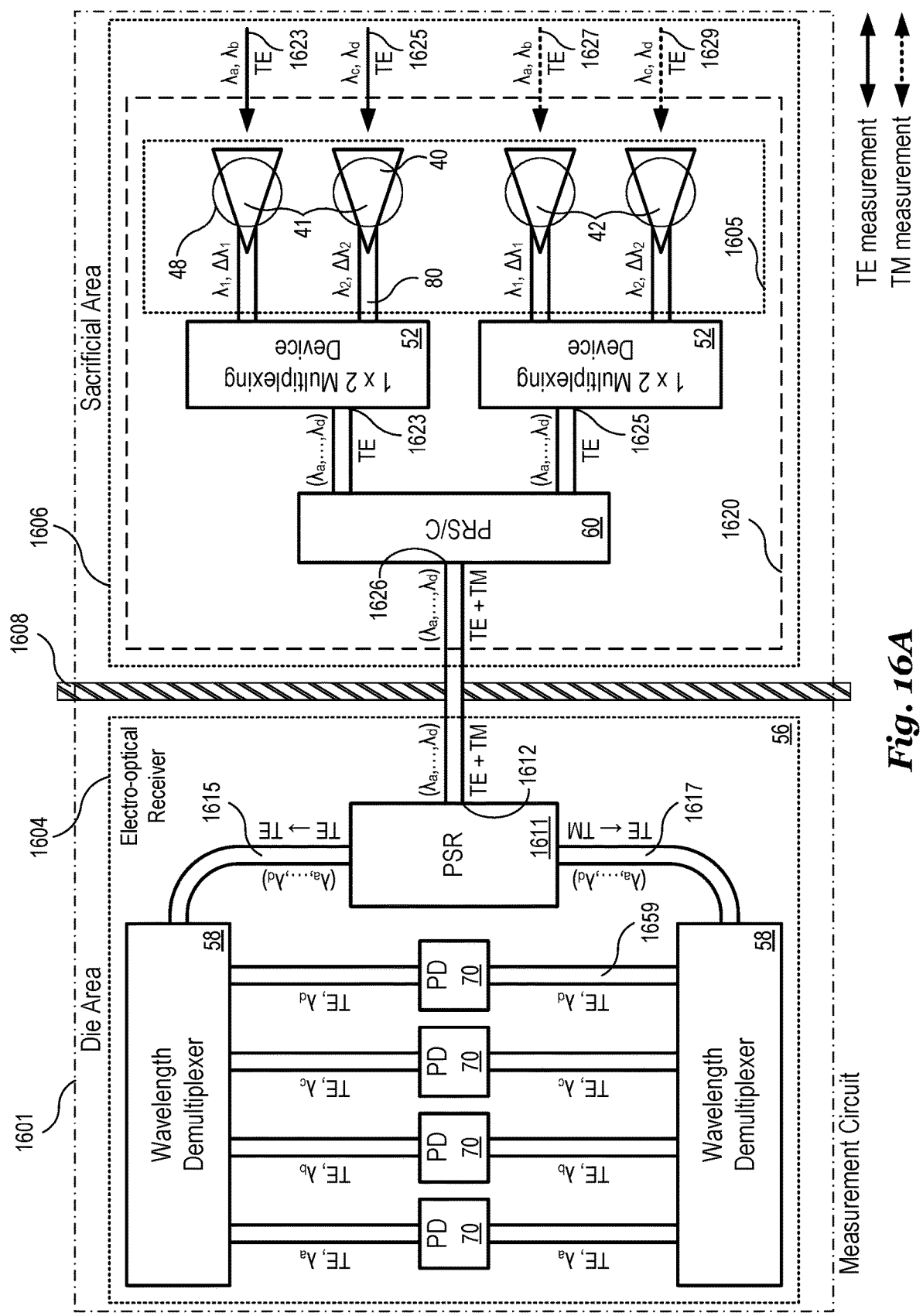
FIGS. 16A and 16B illustrate a schematic diagram of an example photonic testing device which may be used in a photonic wafer level testing system for measuring the response of an electro-optical receiver for a range of wavelengths from about $\lambda_1$ to about $\lambda_n$ and for both TE and TM modes, the photonic testing device including a die area, a sacrificial area, and a sawing lane where
Figure 16B:
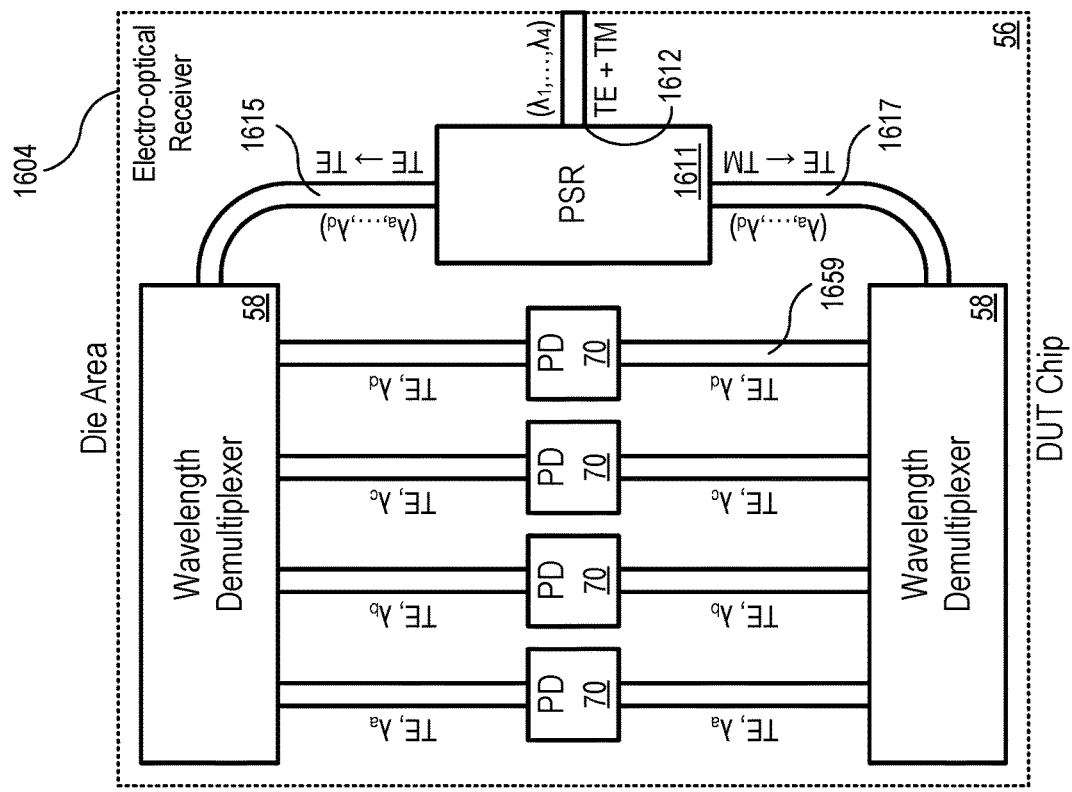

FIGS. 16A and 16B illustrate a schematic diagram of an example photonic testing device which may be used in a photonic wafer level testing system for measuring the response of an electro-optical receiver for a range of wavelengths from about $\lambda_1$ to about $\lambda_n$ and for both TE and TM modes, the photonic testing device including a die area, a sacrificial area, and a sawing lane where FIG. 16A illustrates the photonic testing device before dicing and FIG. 16B illustrates the photonic testing device after dicing in accordance with an embodiment of the invention.

Referring to FIG. 16A, a photonic testing device 1601 includes a die area 1604 comprising an electro-optical receiver 56, a sacrificial area 1606, and a sawing lane 1608. The photonic testing device 1601 is disposed on a single wafer substrate which may be as previously described. Photonic testing device 1601 may be a specific embodiment of other photonic testing devices such as photonic testing device 1501 as described in reference to FIG. 15, for example. Similarly labeled elements are as previously described.

The sacrificial area 1606 includes an optical input circuit 1620 which may be similar to optical input circuit 1120 as described in reference to FIG. 11. For example, optical input circuit 1620 includes four optical grating couplers 40, two 1×2 multiplexing devices 52 and a PRS/C 60. The optical input circuit 1620 includes a first input 1623 and a third input 1627 that are each configured to transmit an optical signal comprising a range of wavelengths that includes a first wavelength $\lambda_a$ and a second wavelength $\lambda_b$. Similarly, optical input circuit 1620 further includes a second input 1625 and a fourth input 1629 that are each configured to transmit an optical signal comprising a range of wavelengths that includes a third wavelength $\lambda_c$ and a fourth wavelength $\lambda_d$.

In various embodiments, the wavelengths $\lambda_a$, $\lambda_b$, $\lambda_c$, and $\lambda_d$ are channels usable for CWDM transmission. In some embodiments, the wavelengths $\lambda_a$, $\lambda_b$, $\lambda_c$ and $\lambda_d$ are channels in the O-band of a CWDM channel designation. In one embodiment, $\lambda_a$=1271 nm, $\lambda_b$=1291 nm, $\lambda_c$=1311 nm, and $\lambda_d$=1331 nm corresponding with the bottom four channels of the O-band. For example, the dominant wavelength may be about $\lambda_1$=1280 nm and the bandpass width may be about $\Delta\lambda_1$=40 nm for the optical grating couplers 40 of the first input 1623 and the third input 1627 while the dominant wavelength may be about $\lambda_2$=1320 nm and the bandpass width may be about $\Delta\lambda_2$=40 nm for the optical grating couplers 40 of the second input 1625 and the fourth input 1629. This may result in a passband ranging from about 1260 nm to about 1300 nm (includes $\lambda_a$ and $\lambda_b$) for the first and third inputs and a passband ranging from about 1300 nm to about 1340 nm (includes $\lambda_c$ and $\lambda_d$) for the second and fourth inputs.

As in previous embodiments, external optical connection may be made to the optical input circuit 1620 using a fiber block 1605 comprising a plurality of fiber connections 48. Two pairs of substantially identical optical test signals including only a single type of transverse mode may be combined by the 1×2 multiplexing devices 52 into intermediate combined optical test signals at a first output 1623 and a second output 1625. The PRS/C 60 may then generate a combined optical test signal including the wavelengths $\lambda_a$, $\lambda_b$, $\lambda_c$, and $\lambda_d$ as well as both TE and TM modes at an output 1626 of the optical input circuit 1620.

The die area 1604 includes a polarization splitter rotator (PSR) 1611. For example, the PSR 1611 may be configured to accept an optical input and then split and/or rotate the optical input to generate outputs. The PSR 1611 is part of the electro-optical receiver 56 that is included within the boundary of die area 1604. The electro-optical receiver circuit 56 may be a specific example of an optical DUT 10 as previously described. PSR 1611 may include a first PSR output waveguide 1615 and a second PSR output waveguide 1617 which may each be optically coupled to a respective wavelength demultiplexer 58 as illustrated.

In one embodiment, the PSR 1611 is configured to split an incoming optical signal received at an input waveguide 1612 into a first intermediate combined response signal comprising the wavelengths $\lambda_a$, $\lambda_b$, $\lambda_c$, and $\lambda_d$ and the TE mode and a second intermediate combined response signal comprising the wavelengths $\lambda_a$, $\lambda_b$, $\lambda_c$, and $\lambda_d$ and the TM mode. The first intermediate combined response signal is transmitted using the first PSR output waveguide 1615 to the corresponding wavelength demultiplexer 58. The second intermediate combined response signal is converted from the TM mode to the TE mode and transmitted using the second PSR output waveguide 1617 to the corresponding wavelength demultiplexer 58.

The first and second intermediate response signals are further split into response signals which each comprise a single channel wavelength ($\lambda_a$, $\lambda_b$, $\lambda_c$, or $\lambda_d$) as illustrated and transmitted to respective photodetectors 70 (PD). The photodetectors 70 may be used as a transduction method by the electro-optical receiver to convert optical signals into electrical signals. Additionally, photodetectors 70 may be used to measure the response of the PSR 1611 to the combined optical test signal generated by optical input circuit 1620 at output 1626 and received by PSR 1611 at input waveguide 1612.

Referring now to FIG. 16B, the die area 1604 of FIG. 16A is illustrated after a dicing process that removes the sacrificial area 1606 and any excess material generated in the sawing lane 1608 during the dicing process. The input waveguide 1612 of PSR 1611 may be advantageously configured to function as both an input of the optical DUT at the wafer level before the dicing process and as an input waveguide for a final coupling system at the die level after the dicing process.

Figure 17A:
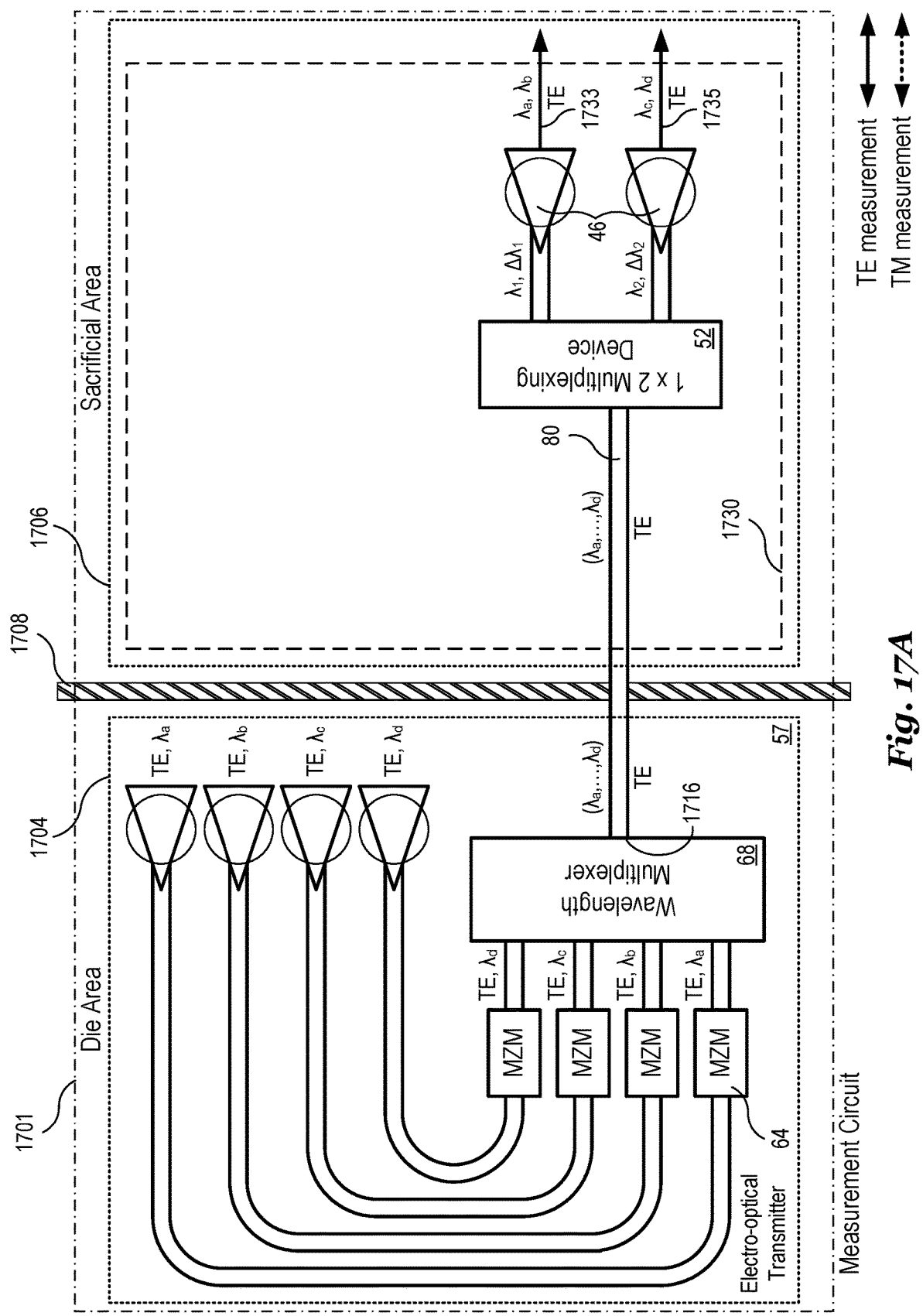
FIGS. 17A and 17B illustrate a schematic diagram of an example photonic testing device which may be used in a photonic wafer level testing system for measuring the response of an electro-optical transmitter for a range of wavelengths from about $\lambda_1$ to about $\lambda_n$ and for the TE mode, the photonic testing device including a die area, a sacrificial area, and a sawing lane where
Figure 17B:
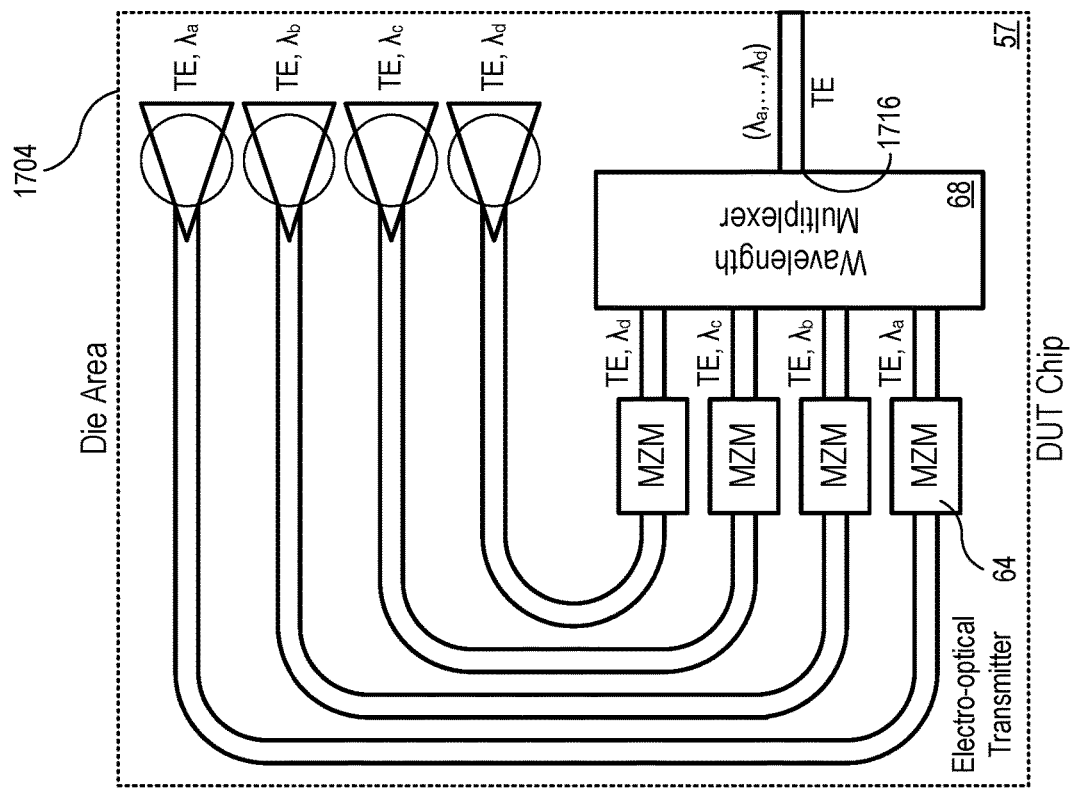

FIGS. 17A and 17B illustrate a schematic diagram of an example photonic testing device which may be used in a photonic wafer level testing system for measuring the response of an electro-optical transmitter for a range of wavelengths from about $\lambda_1$ to about $\lambda_n$ and for the TE mode, the photonic testing device including a die area, a sacrificial area, and a sawing lane where FIG. 17A illustrates the photonic testing device before dicing and FIG. 17B illustrates the photonic testing device after dicing in accordance with an embodiment of the invention.

Referring to FIG. 17A, a photonic testing device 1701 includes a die area 1704 comprising an electro-optical transmitter 57, a sacrificial area 1706, and a sawing lane 1708. The photonic testing device 1701 is disposed on a single wafer substrate which may be as previously described. Photonic testing device 1701 may be a specific embodiment of other photonic testing devices such as photonic testing device 1201 as described in reference to FIG. 12, for example, except that photonic testing device 1701 does not include an optical input circuit. Similarly labeled elements are as previously described.

The sacrificial area 1706 includes an optical output circuit 1730 which may be a specific embodiment of optical output circuit 1030 as described in reference to FIG. 10. For example, optical output circuit 1730 may be configured to separate a combined optical response signal generated by the electro-optical transmitter 57 into first and second optical response signals at a first output 1733 and a second output 1735. The electro-optical transmitter 57 may be a specific embodiment of an optical DUT 10 as previously described.

Referring now to FIG. 17B, the die area 1704 of FIG. 17A is illustrated after a dicing process that removes the sacrificial area 1706 and any excess material generated in the sawing lane 1708 during the dicing process. An output waveguide 1716 of the wavelength multiplexer 68 may be advantageously configured to function as both an output of the optical DUT at the wafer level before the dicing process and as an output waveguide for a final coupling system at the die level after the dicing process.

Figure 18A:
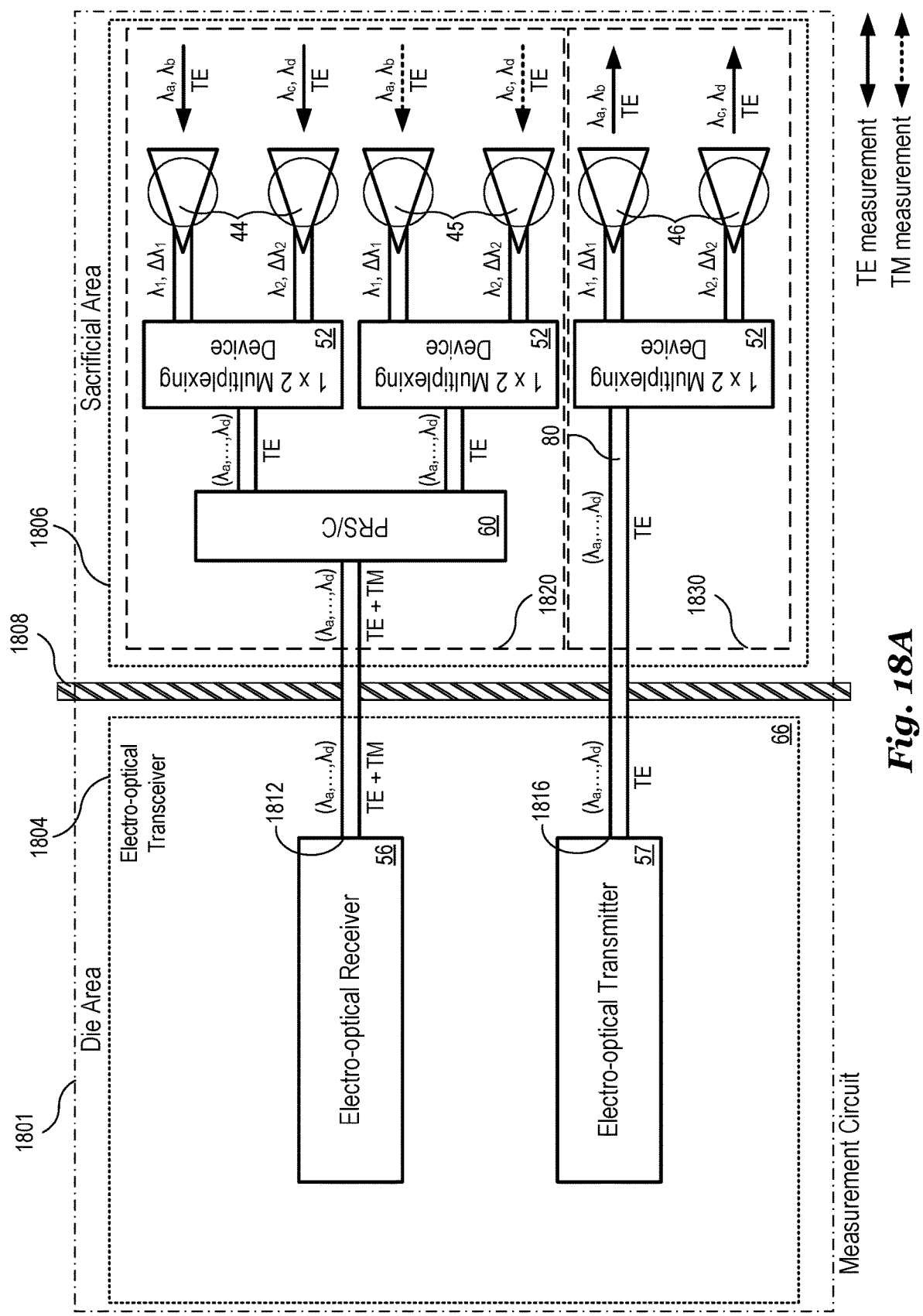
FIGS. 18A and 18B illustrate a schematic diagram of an example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where
Figure 18B:
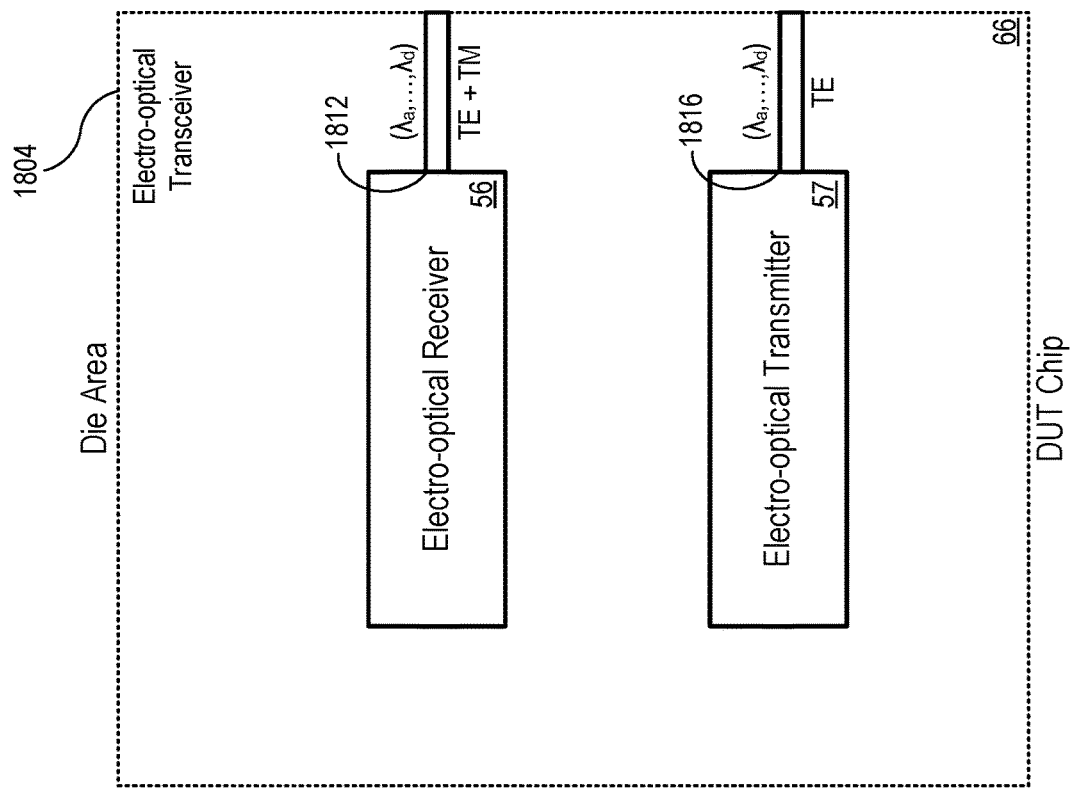

FIGS. 18A and 18B illustrate a schematic diagram of an example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where FIG. 18A illustrates the photonic testing device before dicing and FIG. 18B illustrates the photonic testing device after dicing in accordance with an embodiment of the invention.

Referring to FIG. 18A, a photonic testing device 1801 includes a die area 1804 comprising an electro-optical transceiver 66, a sacrificial area 1806, and a sawing lane 1808. The electro-optical transceiver 66 comprises an electro-optical receiver 56 and an electro-optical transmitter 57.

The photonic testing device 1801 is disposed on a single wafer substrate which may be as previously described. Photonic testing device 1801 may be a specific embodiment of other photonic testing devices such as photonic testing device 1201 as described in reference to FIG. 12, for example, except that photonic testing device 1801 has a different number of inputs (four, for example) and outputs (two, for example). Similarly labeled elements are as previously described.

The sacrificial area 1806 includes an optical input circuit 1820 and an optical output circuit 1830. For example, optical input circuit 1820 may be a specific embodiment of optical input circuit 120 and optical output circuit 1830 may be a specific embodiment of optical input and output circuit 130 as previously described in reference to FIG. 12.

Referring now to FIG. 18B, the die area 1804 of FIG. 18A is illustrated after a dicing process that removes the sacrificial area 1806 and any excess material generated in the sawing lane 1808 during the dicing process. An input waveguide 1812 of the electro-optical receiver 56 may be advantageously configured to function as both an input of the optical DUT at the wafer level and as an input waveguide for a final coupling system at the die level after the dicing process. Similarly, an output waveguide 1816 of the electro-optical transmitter 57 may be advantageously configured to function as both an output of the optical DUT at the wafer level before the dicing process and as an output waveguide for a final coupling system at the die level after the dicing process.

Figure 19A:
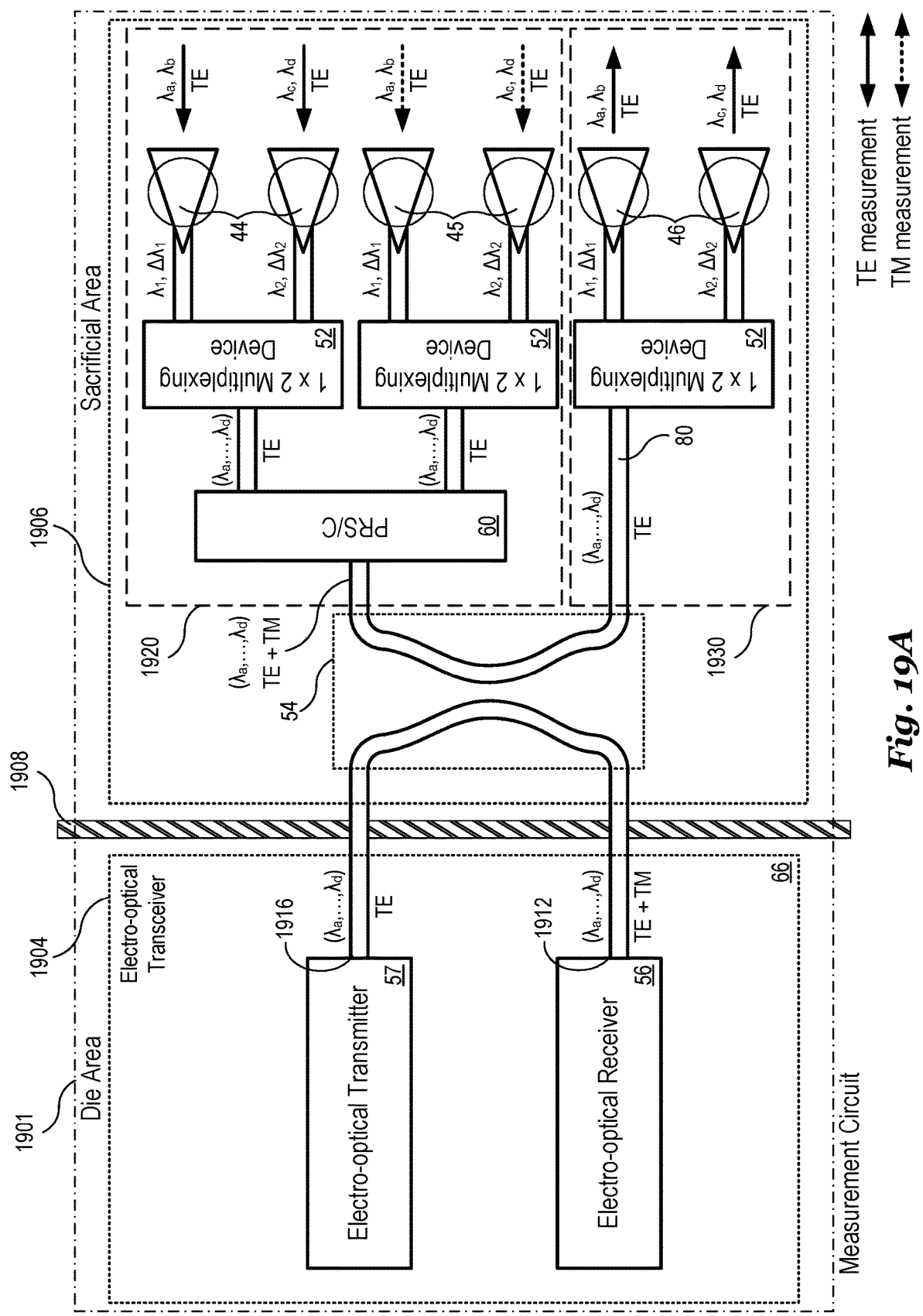
FIGS. 19A and 19B illustrate a schematic diagram of another example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where
Figure 19B:
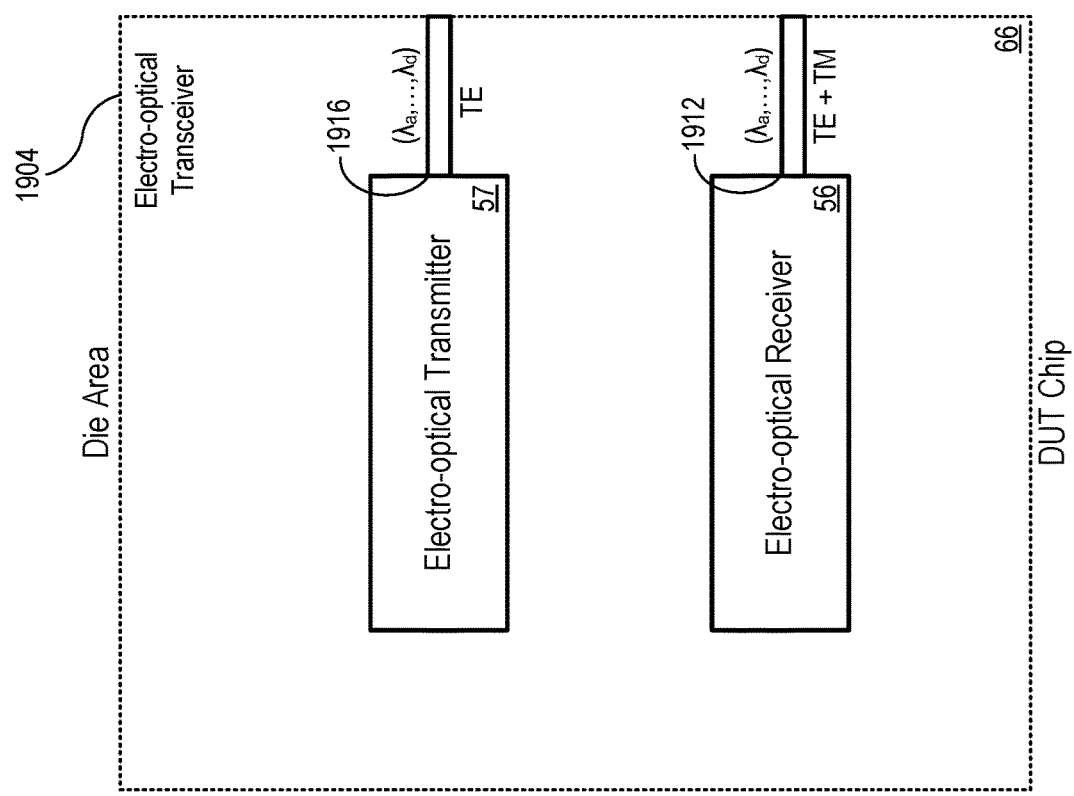

FIGS. 19A and 19B illustrate a schematic diagram of another example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where FIG. 19A illustrates the photonic testing device before dicing and FIG. 19B illustrates the photonic testing device after dicing in accordance with an embodiment of the invention.

Referring to FIGS. 19A and 19B, a photonic testing device 1901 includes a die area 1904 comprising an electro-optical transceiver 66, a sacrificial area 1906, and a sawing lane 1908. Photonic testing device 1901 further includes an optical input circuit 1920 and an optical output circuit 1930. Photonic testing device 1901 is similar to photonic testing device 1801 of FIGS. 18A and 18B except that photonic testing device 1901 includes an optical coupler 54 between the optical input and output circuits and the die area 1904. As with photonic testing device 1801, an input waveguide 1912 of the electro-optical receiver 56 may be advantageously configured to function as both an input of the optical DUT at the wafer level and as an input waveguide for a final coupling system at the die level after the dicing process. Similarly, an output waveguide 1916 of the electro-optical transmitter 57 may be advantageously configured to function as both an output of the optical DUT at the wafer level before the dicing process and as an output waveguide for a final coupling system at the die level after the dicing process.

Figure 20A:
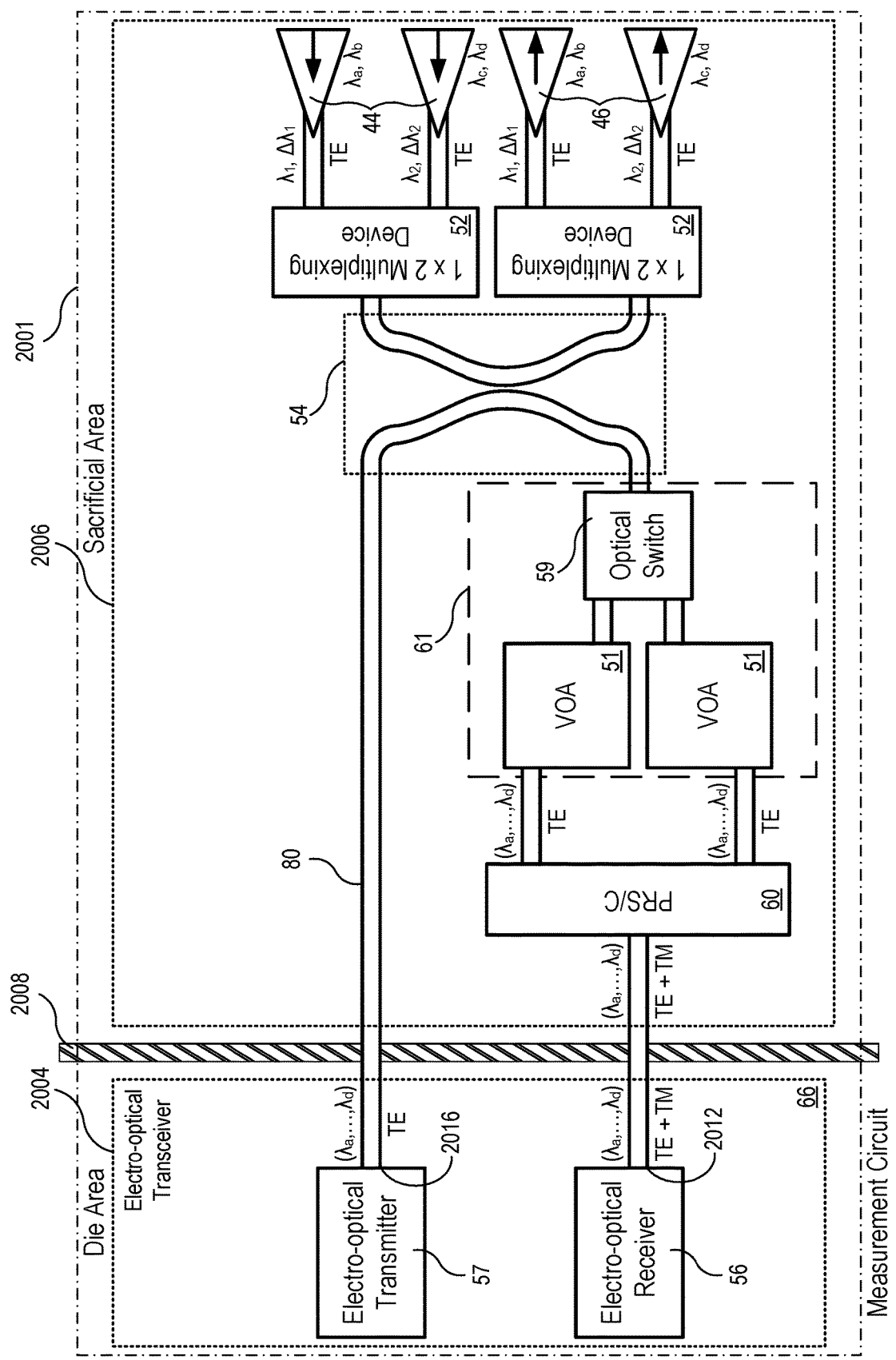
FIGS. 20A and 20B illustrate a schematic diagram of still another example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where
Figure 20B:
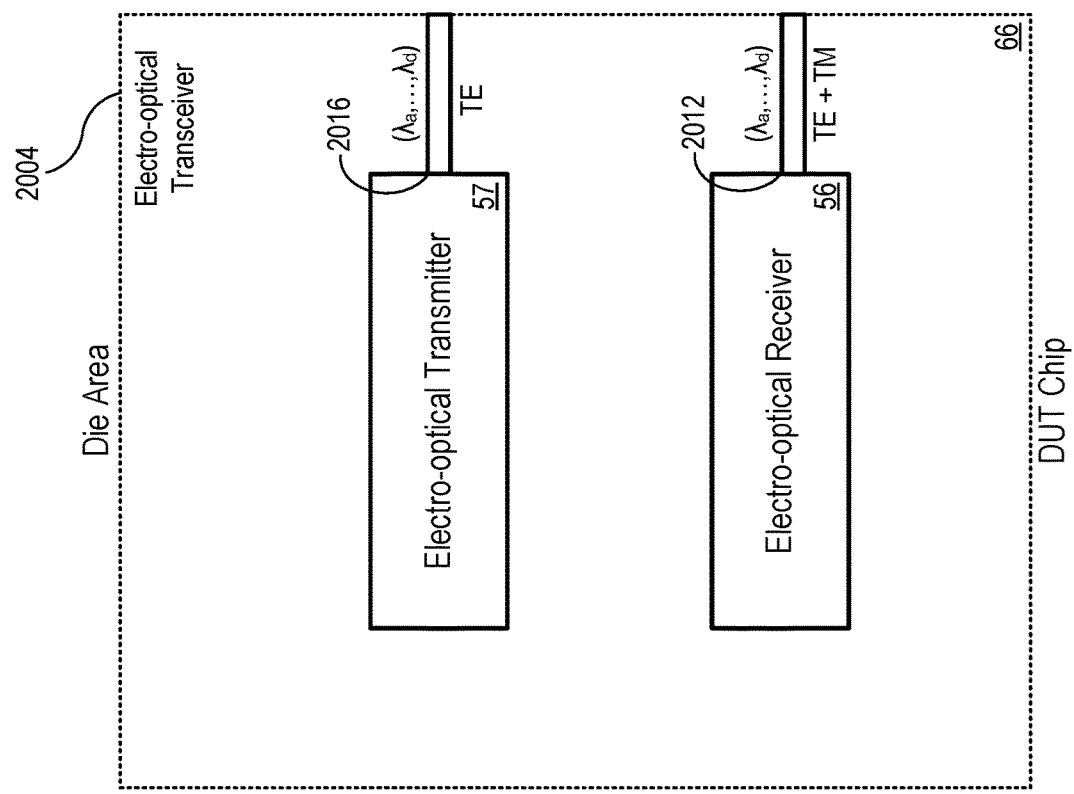

FIGS. 20A and 20B illustrate a schematic diagram of still another example photonic testing device which may be used in a photonic wafer level testing system for measuring the response of an electro-optical transceiver for a range of wavelengths from about $\lambda_1$ to about $\lambda_n$ and for both TE and TM modes, the photonic testing device including a die area, a sacrificial area, and a sawing lane where FIG. 20A illustrates the photonic testing device before dicing and FIG. 20B illustrates the photonic testing device after dicing in accordance with an embodiment of the invention.

Referring to FIGS. 20A and 20B, a photonic testing device 2001 includes a die area 2004 comprising an electro-optical transceiver 66, a sacrificial area 2006, and a sawing lane 2008. Photonic testing device 2001 is similar to photonic testing device 1901 of FIGS. 19A and 19B except that photonic testing device 2001 includes a variable power splitter 61 which may be implemented using a two variable optical attenuators (VOAs) 51 and an optical switch 59. The VOAs 51 may attenuate respective optical signals received from a first pair of input optical grating couplers 44 through the optical switch 59 such that any desired mixture of TE and TM polarization states may be achieved at the optical input 2012.

As with photonic testing device 1901, an input waveguide 2012 of the electro-optical receiver 56 may be advantageously configured to function as both an input of the optical DUT at the wafer level and as an input waveguide for a final coupling system at the die level after the dicing process. Similarly, an output waveguide 2016 of the electro-optical transmitter 57 may be advantageously configured to function as both an output of the optical DUT at the wafer level before the dicing process and as an output waveguide for a final coupling system at the die level after the dicing process.

Figure 21A:
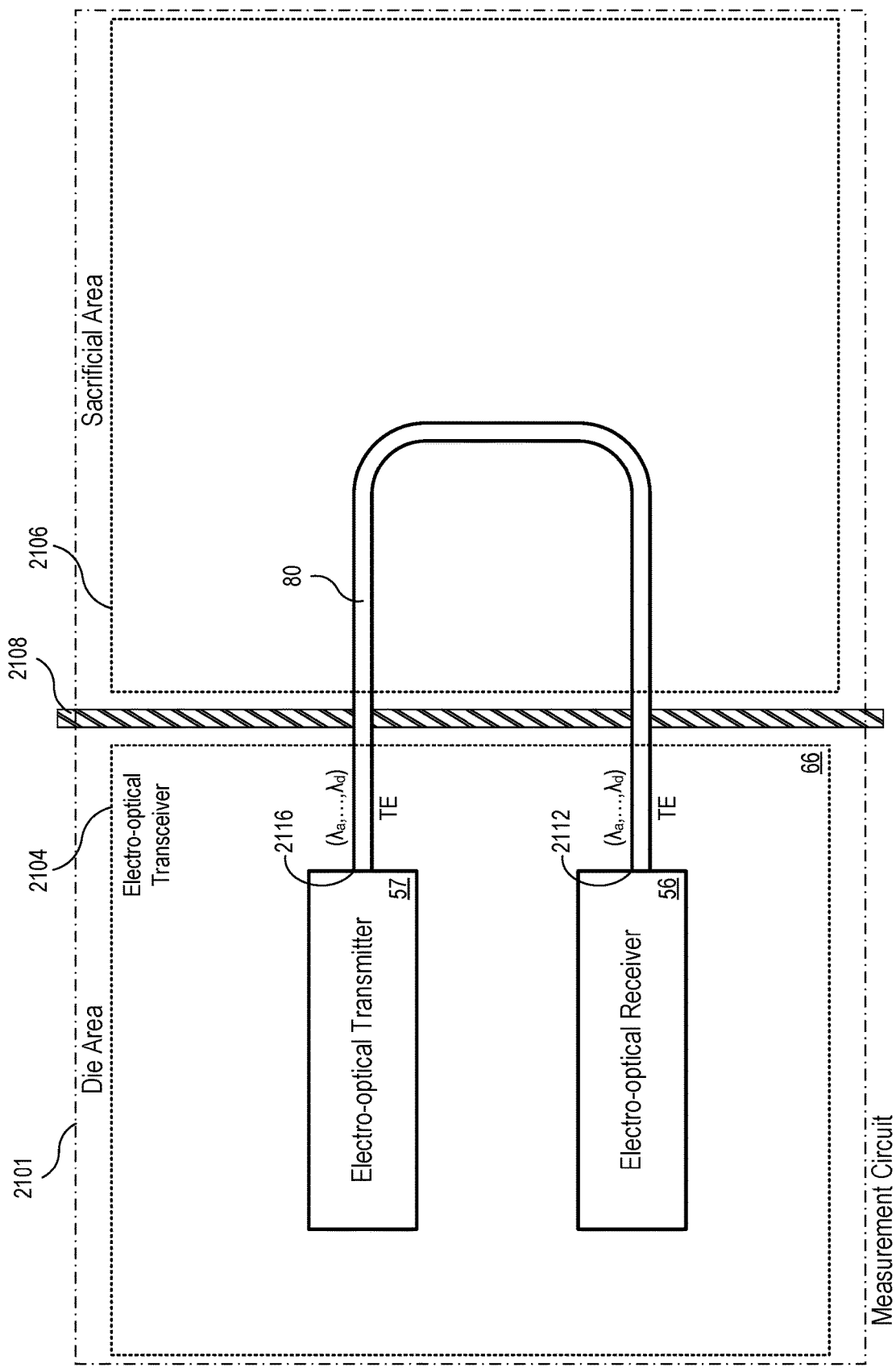
FIGS. 21A and 21B illustrate a schematic diagram of an example photonic testing device which may be used in a photonic wafer level testing system for measuring the response of an electro-optical transceiver in which an electro-optical transmitter and electro-optical receiver of the electro-optical transceiver administer a self-test, the photonic testing device including a die area, a sacrificial area, and a sawing lane where
Figure 21B:
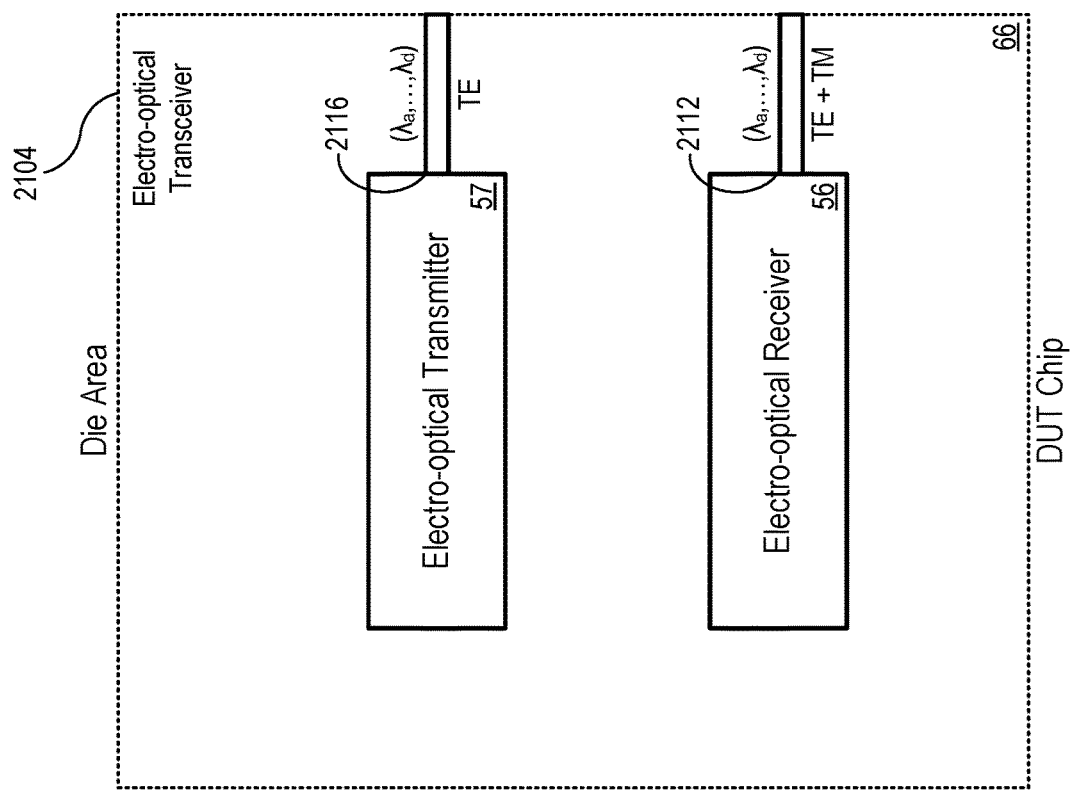

FIGS. 21A and 21B illustrate a schematic diagram of an example photonic testing device which may be used in a photonic wafer level testing system for measuring the response of an electro-optical transceiver in which an electro-optical transmitter and electro-optical receiver of the electro-optical transceiver administer a self-test, the photonic testing device including a die area, a sacrificial area, and a sawing lane where FIG. 21A illustrates the photonic testing device before dicing and FIG. 21B illustrates the photonic testing device after dicing in accordance with an embodiment of the invention.

Referring to FIGS. 21A and 21B, a photonic testing device 2101 includes a die area 2104 comprising an electro-optical transceiver 66, a sacrificial area 2106, and a sawing lane 2108. The photonic testing device 2101 is configured to administer a self-test using an output waveguide 2116 coupled to an electro-optical transmitter 57. The electro-optical transmitter 57 transmits an optical test signal through a waveguide 80 in the sacrificial area 2106 to an input waveguide 2112 of an electro-optical receiver 56. In one embodiment, photonic testing device 2101 is configured to administer a self-test over a broad range of wavelengths for a single polarization state.

For example, the self-test may be administered by evaluating the received optical signal at the electro-optical receiver 56. If the received optical signal is as expected, then both the electro-optical receiver 56 and the electro-optical transmitter 57 may be assumed to working properly since the optical test signal is generated by the electro-optical transmitter 57 and received by the electro-optical receiver 56. If the received optical signal differs from an expected optical signal, then specific information about which of the electro-optical receiver 56 and the electro-optical transmitter 57 is malfunctioning may be determined based on the particular deviations of the received optical signal from the expected optical signal.

Figure 22A:
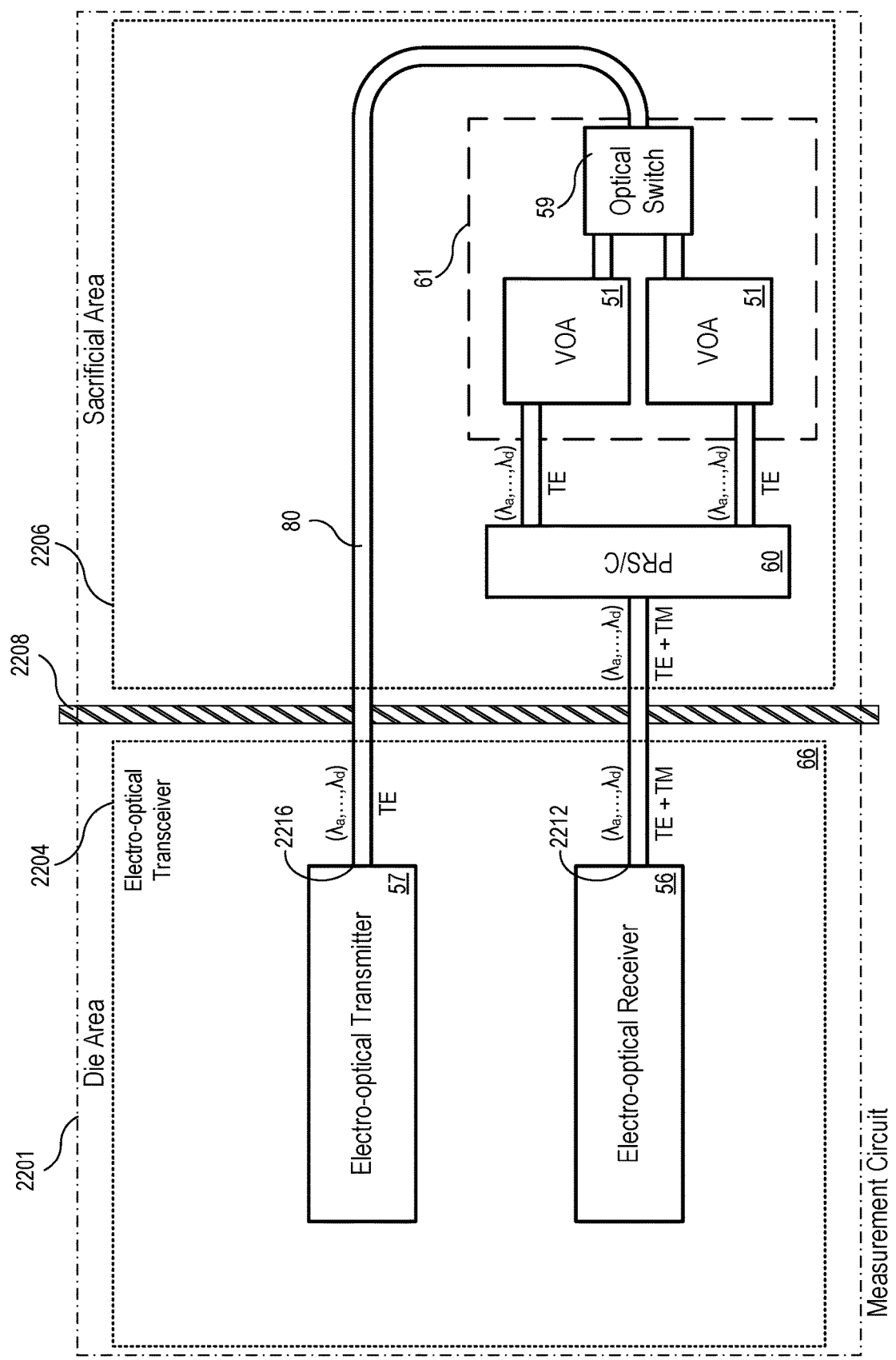
FIGS. 22A and 22B illustrate a schematic diagram of another example photonic testing device which may be used in a photonic wafer level testing system for measuring the response of an electro-optical transceiver in which an electro-optical transmitter and electro-optical receiver of the electro-optical transceiver administer a self-test, the photonic testing device including a die area, a sacrificial area, and a sawing lane where
Figure 22B:
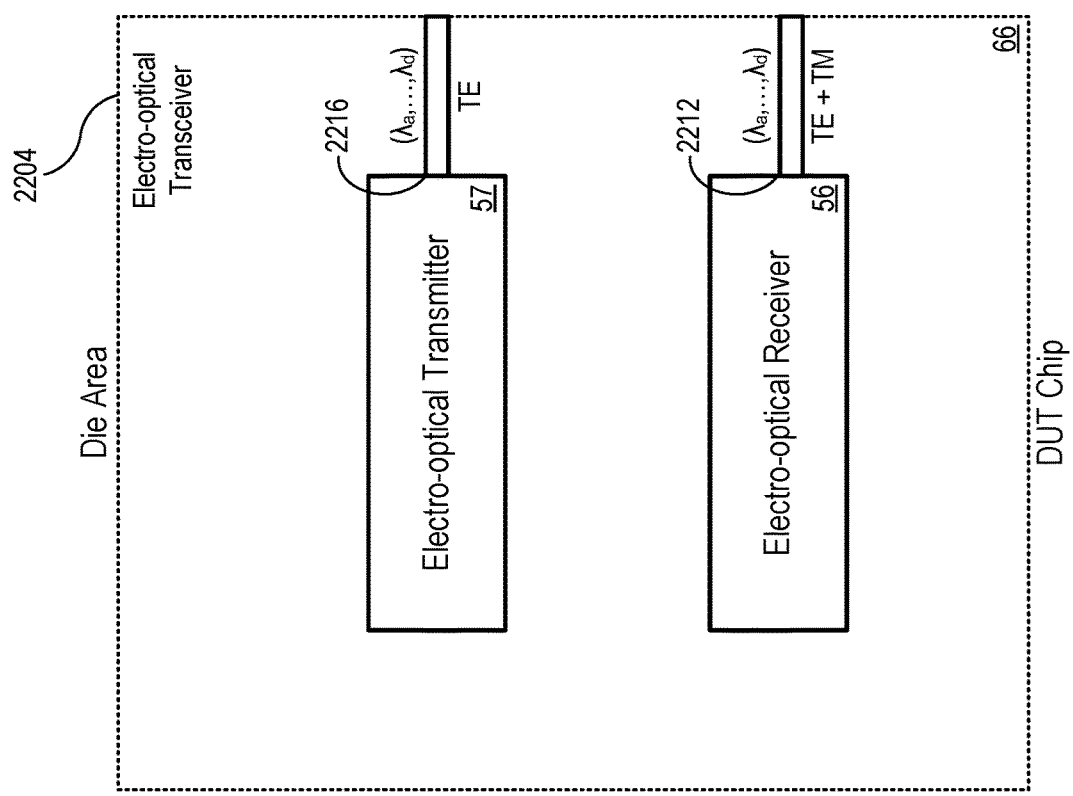

FIGS. 22A and 22B illustrate a schematic diagram of another example photonic testing device which may be used in a photonic wafer level testing system for measuring the response of an electro-optical transceiver in which an electro-optical transmitter and electro-optical receiver of the electro-optical transceiver administer a self-test, the photonic testing device including a die area, a sacrificial area, and a sawing lane where FIG. 22A illustrates the photonic testing device before dicing and FIG. 22B illustrates the photonic testing device after dicing in accordance with an embodiment of the invention.

Referring to FIGS. 22A and 22B, a photonic testing device 2201 includes a die area 2204 comprising an electro-optical transceiver 66, a sacrificial area 2206, and a sawing lane 2208. The photonic testing device 2201 is configured to administer a self-test using an output waveguide 2216 coupled to an electro-optical transmitter 57. The electro-optical transmitter 57 transmits an optical test signal through a waveguide 80 in the sacrificial area 2206 to an input waveguide 2212 of an electro-optical receiver 56.

The photonic testing device 2201 is similar to photonic testing device 2101 of FIG. 20 except that photonic testing device 2201 is configured to administer a self-test over a broad range of wavelengths and with polarization state selection. Photonic testing device 2201 includes a variable power splitter 61 which may be implemented using two VOAs 51 and an optical switch 59. The electro-optical transmitter 57 may be configured to transmit an optical signal from an optical output 2216 to the optical switch 59 of variable power splitter 61. The VOAs 51 may then attenuate respective optical signals received from the optical switch 59 such that any desired mixture of TE and TM polarization states may be achieved at the optical input 2212.

Figure 23:
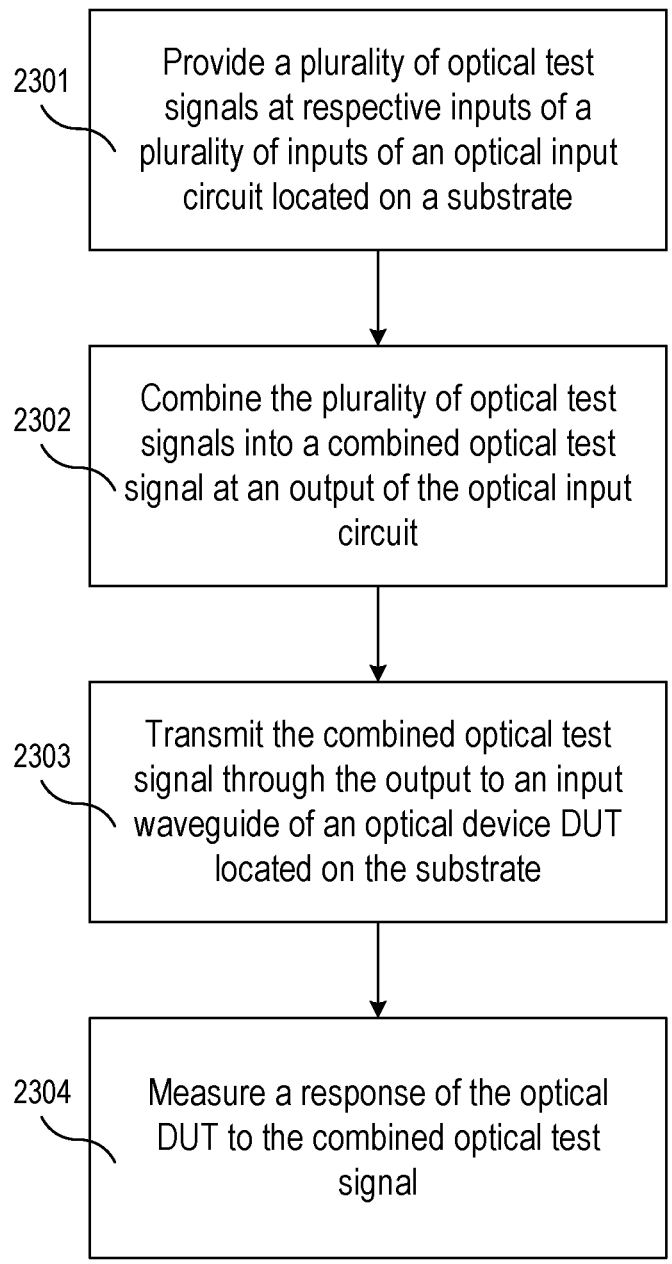
FIG. 23 illustrates a method of testing a photonic device in accordance with an embodiment of the invention.

FIG. 23 illustrates a method of testing a photonic device in accordance with an embodiment of the invention.

Step 2301 of testing the photonic device includes providing a plurality of optical test signals at respective inputs of a plurality of inputs of an optical input circuit located on a substrate. Each of the plurality of optical test signals may have a respective dominant wavelength. For example, in one embodiment, each of the optical test signals may be transmitted with a corresponding dominant wavelength of a set of dominant wavelengths. The plurality of inputs may be implemented as a plurality of optical grating couplers in some embodiments.

Step 2302 of testing the photonic device includes combining the plurality of optical test signals into a combined optical test signal at an output of the optical input circuit. Testing of the optical DUT over both the TE mode and the TM mode may be desirable. In this case, the method of testing the photonic device may further include an optional step of providing the plurality of optical test signals at respective inputs of an additional plurality of inputs of the optical input circuit. Step 2302 would then further include combining both the optical test signals from the plurality of inputs and the optical test signals from the additional plurality of inputs into the combined optical test signal.

In one embodiment, the plurality of optical test signals provided at both plurality of inputs include only a single type of transverse mode, the single type of transverse mode being the TE mode. In one embodiment, the combined optical test signal comprises exactly two types of transverse mode, the two types of transverse mode being the TE mode and the TM mode.

Step 2303 of testing the photonic device includes transmitting the combined optical test signal through the output to an input waveguide of an optical device under test (DUT), the optical DUT being located on the substrate.

Step 2304 of testing the photonic device includes measuring a response of the optical DUT to the combined optical test signal. Optionally, if the response of the optical DUT is an optical response, additional steps of transmitting a combined optical response signal through an output waveguide of the optical DUT to an input of an optical output circuit and splitting the combined response signal into the plurality of optical response signals at a plurality of outputs of the optical output circuit may also be included in the method of testing the photonic device. In this case, step 2304 would also include measuring the response at each of the plurality of outputs of the optical output circuit.

Example embodiments of the invention are summarized here. Other embodiments can also be understood from the entirety of the specification as well as the claims filed herein.

Example 1. A photonic testing device including a substrate; an optical device under test (DUT) disposed over the substrate; and an optical input circuit disposed over the substrate, the optical input circuit including a first plurality of inputs each configured to transmit a respective optical test signal of a plurality of optical test signals, where each of the plurality of optical test signals includes a respective dominant wavelength of a plurality of dominant wavelengths, and an output coupled to an input waveguide of the optical DUT, the output being configured to transmit a combined optical test signal including the plurality of optical test signals.

Example 2. The photonic testing device of example 1, further including an optical output circuit disposed on the substrate, the optical output circuit including an input coupled to an output waveguide of the optical DUT, the input being configured to transmit a combined optical response signal including a plurality of optical response signals, where each of the optical response signals of the plurality of optical response signals includes a respective dominant wavelength of the plurality of dominant wavelengths, and a first plurality of outputs each configured to transmit a respective optical response signal of the plurality of optical response signals.

Example 3. The photonic testing device of one of examples 1 and 2, where each of the first plurality of inputs and each of the first plurality of outputs includes an optical grating coupler.

Example 4. The photonic testing device of one of examples 1 to 3, where the plurality of dominant wavelengths includes a minimum dominant wavelength and a maximum dominant wavelength, and where a difference between the maximum dominant wavelength and the minimum dominant wavelength is greater than a −1 dB bandwidth of each of the first plurality of inputs.

Example 5. The photonic testing device of one of examples 1 to 4, where the plurality of dominant wavelengths includes a minimum dominant wavelength and a maximum dominant wavelength and where a difference between the maximum dominant wavelength and the minimum dominant wavelength is greater than or equal to 20 nm.

Example 6. The photonic testing device of example 5, where the minimum dominant wavelength is less than or equal to 1270 nm and the maximum dominant wavelength is greater than or equal to 1330 nm.

Example 7. The photonic testing device of one of examples 1 to 6, where the optical DUT is disposed in a die area of the substrate; and the optical input circuit is disposed in a sacrificial area of the substrate.

Example 8. The photonic testing device of one of examples 1 to 7, where the optical input circuit further includes a second plurality of inputs corresponding to the first plurality of inputs in a one to one ratio; each of the second plurality of inputs is configured to transmit a respective optical test signal identical to the respective optical test signal of the corresponding input of the first plurality of inputs, the respective optical test signals transmitted by the first plurality of inputs include only a single type of transverse mode, the single type of transverse mode being the transverse electric (TE) mode, the respective optical test signals transmitted by the second plurality of inputs include only the single type of transverse mode, and the combined optical test signal includes exactly two types of transverse mode, the two types of transverse mode being the TE mode and the transverse magnetic (TM) mode.

Example 9. A method of testing a photonic device, the method including providing a plurality of optical test signals at respective inputs of a first plurality of inputs of an optical input circuit located on a substrate, where each of the plurality of optical test signals includes a respective dominant wavelength of a plurality of dominant wavelengths, combining the plurality of optical test signals into a combined optical test signal at an output of the optical input circuit; transmitting the combined optical test signal through the output to an input waveguide of an optical device under test (DUT), the optical DUT being located on the substrate; and measuring a response of the optical DUT to the combined optical test signal.

Example 10. The method of example 9, further including transmitting a combined optical response signal through an output waveguide of the optical DUT to an input of an optical output circuit, where the optical output circuit is located on the substrate, the combined optical response signal includes a plurality of optical response signals, and each of the optical response signals of the plurality of optical response signals includes a respective dominant wavelength of the plurality of dominant wavelengths; and splitting the combined response signal into the plurality of optical response signals at a plurality of outputs of the optical output circuit, where measuring the response includes measuring the response at each of the plurality of outputs of the optical output circuit.

Example 11. The method of one of examples 9 and 10, where each of the first plurality of inputs includes an optical grating coupler.

Example 12. The method of one of examples 9 to 11, where the plurality of dominant wavelengths includes a minimum dominant wavelength and a maximum dominant wavelength, and where a difference between the maximum dominant wavelength and the minimum dominant wavelength is greater than a −1 dB bandwidth of each of the first plurality of inputs.

Example 13. The method of one of examples 9 to 12, where the plurality of dominant wavelengths includes a minimum dominant wavelength and a maximum dominant wavelength and where a difference between the maximum dominant wavelength and the minimum dominant wavelength is greater than or equal to 20 nm.

Example 14. The method of example 13, where the minimum dominant wavelength is less than or equal to 1270 nm and the maximum dominant wavelength is greater than or equal to 1330 nm.

Example 15. The method of one of examples 9 to 14, where the optical DUT is located in a die area of the substrate; and the optical input circuit is located in a sacrificial area of the substrate.

Example 16. The method of one of examples 9 to 15, further including providing the plurality of optical test signals at respective inputs of a second plurality of inputs of the optical input circuit, where the second plurality of inputs corresponds to the first plurality of inputs in a one to one ratio; combining the plurality of optical test signals includes combining both the optical test signals from the first plurality of inputs and the optical test signals from the second plurality of inputs into the combined optical test signal; the plurality of optical test signals provided at the first plurality of inputs include only a single type of transverse mode, the single type of transverse mode being the transverse electric (TE) mode; the plurality of optical test signals provided at the second plurality of inputs include only the single type of transverse mode; and the combined optical test signal includes exactly two types of transverse mode, the two types of transverse mode being the TE mode and the transverse magnetic (TM) mode.

Example 17. A photonic testing device including a substrate; a first optical grating coupler disposed over the substrate and configured to receive a first optical test signal including a first dominant wavelength and only a single type of transverse mode, the single type of transverse mode being the transverse electric (TE) mode; a second optical grating coupler configured to receive a second optical test signal identical to the first optical test signal; and an optical input circuit disposed over the substrate, the optical input circuit including a first input coupled to the first optical grating coupler, a second input coupled to the second optical grating, and an output configured to be coupled to an input waveguide of an optical DUT, the output being further configured to transmit a combined optical test signal including exactly two types of transverse mode, the two types of transverse mode being the TE mode and the transverse magnetic (TM) mode.

Example 18. The photonic testing device of example 17, further including a third optical grating coupler coupled to a third input of the optical input circuit, the third optical grating coupler being configured to receive a third optical test signal including a second dominant wavelength and only the single type of transverse mode; and a fourth optical grating coupler coupled to a fourth input of the optical input circuit, the fourth optical grating coupler being configured to receive a fourth optical test signal identical to the third optical test signal, where the combined optical test signal further includes the first dominant wavelength and the second dominant wavelength.

Example 19. The photonic testing device of example 18, where a difference between the first dominant wavelength and the second dominant wavelength is greater than the −1 dB bandwidth of the first optical grating coupler.

Example 20. The photonic testing device of example 18, where a difference between the first dominant wavelength and the second dominant wavelength is greater than or equal to 20 nm.

Example 21. The photonic testing device of one of examples 18 to 20, where the first dominant wavelength is less than or equal to 1270 nm and the second dominant wavelength is greater than or equal to 1330 nm.

Example 22. The photonic device of one of examples 17 to 21, where the optical DUT is disposed in a die area of the substrate; and the first optical grating coupler, the second optical grating coupler, and the optical input circuit are each disposed in a sacrificial are of the substrate.

Example 23. The photonic device of one of examples 17 to 22, where the optical DUT is an electro-optical receiver.

Example 24. The photonic device of one of examples 17 to 22, where the optical DUT is an electro-optical transmitter.

Example 25. The photonic device of one of examples 17 to 22, where the optical DUT is an electro-optical transceiver.

Example 26. The photonic device of example 25, where the electro-optical transceiver includes an electro-optical transmitter and an electro-optical receiver, and where the photonic device is configured to administer a self-test by transmitting an optical signal from the electro-optical transmitter to the electro-optical receiver.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A photonic testing device comprising:
   a substrate;
   a first optical grating coupler disposed over the substrate and configured to receive and transmit a first optical test signal centered around a first dominant wavelength and having only a single type of transverse mode, the single type of transverse mode being the transverse electric (TE) mode;
   a second optical grating coupler configured to receive and transmit a second optical test signal identical to the first optical test signal, the second optical grating coupler being spatially separate from the first optical grating coupler, wherein each of the first optical grating coupler and the second optical grating coupler is a single polarization grating coupler comprising a first bandpass width centered around the first dominant wavelength; and
   an optical input circuit disposed over the substrate, the optical input circuit comprising a first input coupled to the first optical grating coupler,
a second input coupled to the second optical grating coupler,
an output configured to be coupled to an input waveguide of an optical DUT, the output being further configured to transmit a combined optical test signal, and
a polarization rotator splitter/combiner (PRS/C) coupled to the first input, the second input, and the output, the PRS/C being configured to convert the second optical test signal from the TE mode to the transverse magnetic (TM) mode and to combine the first optical test signal and the second optical test signal to form the combined optical test signal, wherein the combined optical test signal comprises exactly two types of transverse mode, the two types of transverse mode being the TE mode and the TM mode.

2. The photonic testing device of claim 1, further comprising:
a third optical grating coupler coupled to a third input of the optical input circuit, the third optical grating coupler being configured to receive and transmit a third optical test signal centered around a second dominant wavelength and having only the single type of transverse mode; and
a fourth optical grating coupler coupled to a fourth input of the optical input circuit, the fourth optical grating coupler being configured to receive transmit a fourth optical test signal identical to the third optical test signal, wherein
the first, second, third, and fourth optical grating coupler are spatially separate from one another,
each of the third optical grating coupler and the fourth optical grating coupler is a single polarization grating coupler comprising a second bandpass width centered around the second dominant wavelength, and
the combined optical test signal further comprises the first dominant wavelength and the second dominant wavelength.

3. The photonic testing device of claim 2, wherein the difference between the first dominant wavelength and the second dominant wavelength is greater than the 1 dB bandwidth of the first optical grating coupler.

4. The photonic testing device of claim 2, wherein the difference between the first dominant wavelength and the second dominant wavelength is greater than or equal to 20 nm.

5. The photonic testing device of claim 1, wherein:
the optical DUT is disposed in a die area of the substrate; and
the first optical grating coupler, the second optical grating coupler, and the optical input circuit are each disposed in a sacrificial area of the substrate.

6. The photonic testing device of claim 1, wherein the optical DUT is an electro-optical receiver.

7. The photonic testing device of claim 1, wherein the optical DUT is an electro-optical transmitter.

8. The photonic testing device of claim 1, wherein the optical DUT is an electro-optical transceiver.

9. The photonic testing device of claim 8, wherein the electro-optical transceiver comprises an electro-optical transmitter and an electro-optical receiver, and wherein the photonic testing device is configured to administer a self-test by transmitting an optical signal from the electro-optical transmitter to the electro-optical receiver.

10. The photonic testing device of claim 1, wherein:
the optical input circuit further comprises a first plurality of inputs comprising the first input, each of the first plurality of inputs being configured to transmit a respective optical test signal of a first plurality of optical test signals comprising the first optical test signal, wherein each of the first plurality of optical test signals comprises a respective dominant wavelength of a plurality of dominant wavelengths;
the optical input circuit further comprises a second plurality of inputs comprising the second input and corresponding to the first plurality of inputs in a one to one ratio, each of the second plurality of inputs being configured to transmit a respective optical test signal of a second plurality of optical test signals comprising the second optical test signal, the second plurality of optical test signals being identical to the first plurality of optical test signals; and
the output is further configured to transmit the combined optical test signal comprising the first plurality of optical test signals and the second plurality of optical test signals.

11. The photonic testing device of claim 10, further comprising:
an optical output circuit disposed on the substrate, the optical output circuit comprising
an input coupled to an output waveguide of the optical DUT, the input being configured to transmit a combined optical response signal comprising a plurality of optical response signals, wherein each of the optical response signals of the plurality of optical response signals comprises a respective dominant wavelength of the plurality of dominant wavelengths, and
a first plurality of outputs each configured to transmit a respective optical response signal of the plurality of optical response signals.

12. The photonic testing device of claim 10, wherein each of the first plurality of inputs and each of the first plurality of inputs comprises an optical grating coupler.

13. The photonic testing device of claim 10, wherein the plurality of dominant wavelengths comprises a minimum dominant wavelength and a maximum dominant wavelength, and wherein the difference between the maximum dominant wavelength and the minimum dominant wavelength is greater than a −1 dB bandwidth of each of the first plurality of inputs.

14. The photonic testing device of claim 10, wherein the plurality of dominant wavelengths comprises a minimum dominant wavelength and a maximum dominant wavelength and wherein the difference between the maximum dominant wavelength and the minimum dominant wavelength is greater than or equal to 20 nm.

15. The photonic testing device of claim 10, wherein:
the optical DUT is disposed in a die area of the substrate; and
the optical input circuit is disposed in a sacrificial area of the substrate.

16. The photonic testing device of claim 10, wherein:
the respective optical test signals of the first plurality of optical test signals transmitted by the first plurality of inputs comprise only a single type of transverse mode, the single type of transverse mode being the TE mode,
the respective optical test signals of the second plurality of optical test signals transmitted by the second plurality of inputs comprise only the single type of transverse mode, and the combined optical test signal comprises exactly two types of transverse mode, the two types of transverse mode being the TE mode and the TM mode.

17. A photonic testing device comprising:
a substrate;
a first optical grating coupler disposed over the substrate and configured to receive and transmit a first optical test signal centered around a first dominant wavelength and having only a single type of transverse mode, the single type of transverse mode being the transverse electric (TE) mode;
a second optical grating coupler configured to receive and transmit a second optical test signal identical to the first optical test signal, wherein each of the first optical grating coupler and the second optical grating coupler comprises a first bandpass width centered around the first dominant wavelength;
a third optical grating coupler configured to receive and transmit a third optical test signal centered around a second dominant wavelength and having only the single type of transverse mode; and
a fourth optical grating coupler configured to receive and transmit a fourth optical test signal identical to the third optical test signal, the first, second, third, and fourth optical grating couplers being spatially separate from one another, wherein each of the third optical grating coupler and the fourth optical grating coupler comprises a second bandpass width centered around the second dominant wavelength, and wherein each of the first, second, third, and fourth optical grating couplers is a single polarization grating coupler; and
an optical input circuit disposed over the substrate, the optical input circuit comprising
a first input coupled to the first optical grating coupler,
a second input coupled to the second optical grating coupler,
a third input coupled to the third optical grating coupler,
a fourth input coupled to the fourth optical grating coupler,
an output configured to be coupled to an input waveguide of an optical DUT disposed in a die area of the substrate, the output being further configured to transmit a combined optical test signal, and
a polarization rotator splitter/combiner (PRS/C) coupled to the first input, the second input, and the output, the PRS/C being configured to convert the second optical test signal from the TE mode to the transverse magnetic (TM) mode and to combine the first optical test signal and the second optical test signal to form the combined optical test signal, wherein the combined optical test signal comprises the first dominant wavelength and the second dominant wavelength and exactly two types of transverse mode, the two types of transverse mode being the TE mode and the TM mode; and
wherein the first optical grating coupler, the second optical grating coupler, the third optical grating coupler, the fourth optical grating coupler, and the optical input circuit are each disposed in a sacrificial area of the substrate.

18. The photonic testing device of claim 17, wherein the optical DUT is an electro-optical receiver.

19. The photonic testing device of claim 17, wherein the optical DUT is an electro-optical transmitter.

20. The photonic testing device of claim 17, wherein:
the optical DUT is an electro-optical transceiver comprising an electro-optical transmitter and an electro-optical receiver; and
the photonic testing device is configured to administer a self-test by transmitting an optical signal from the electro-optical transmitter to the electro-optical receiver.

21. A photonic testing device comprising:
a substrate;
a first optical grating coupler disposed over the substrate and configured to receive and transmit a first optical test signal centered around a first dominant wavelength and having only a single type of transverse mode, the single type of transverse mode being the transverse electric (TE) mode;
a second optical grating coupler configured to receive and transmit a second optical test signal identical to the first optical test signal, wherein each of the first optical grating coupler and the second optical grating coupler comprises a first bandpass width centered around the first dominant wavelength;
a third optical grating coupler configured to receive and transmit a third optical test signal centered around a second dominant wavelength and having only the single type of transverse mode; and
a fourth optical grating coupler configured to receive and transmit a fourth optical test signal identical to the third optical test signal, the first, second, third, and fourth optical grating couplers being spatially separate from one another, wherein each of the third optical grating coupler and the fourth optical grating coupler comprises a second bandpass width centered around the second dominant wavelength, and wherein each of the first, second, third, and fourth optical grating couplers is a single polarization grating coupler;
an optical input circuit disposed over the substrate, the optical input circuit comprising
a first input coupled to the first optical grating coupler,
a second input coupled to the second optical grating coupler,
a third input coupled to the third optical grating coupler,
a fourth input coupled to the fourth optical grating coupler,
an output configured to be coupled to an input waveguide of an optical DUT, the output being further configured to transmit a combined optical test signal, and
a polarization rotator splitter/combiner (PRS/C) coupled to the first input, the second input, and the output, the PRS/C being configured to convert the second optical test signal from the TE mode to the transverse magnetic (TM) mode and to combine the first optical test signal and the second optical test signal to form the combined optical test signal, wherein the combined optical test signal comprises the first dominant wavelength and the second dominant wavelength and exactly two types of transverse mode, the two types of transverse mode being the TE mode and the TM mode;
wherein the difference between the first dominant wavelength and the second dominant wavelength is greater than the −1 dB bandwidth of the first optical grating coupler; and
wherein the difference between the first dominant wavelength and the second dominant wavelength is greater than or equal to 20 nm.

22. The photonic testing device of claim 21, wherein:
the optical DUT is disposed in a die area of the substrate; and
the first optical grating coupler, the second optical grating coupler, the third optical grating coupler, the fourth optical grating coupler, and the optical input circuit are each disposed in a sacrificial area of the substrate.

23. The photonic testing device of claim 21, wherein:
the optical DUT is an electro-optical transceiver comprising an electro-optical transmitter and an electro-optical receiver; and
the photonic testing device is configured to administer a self-test by transmitting an optical signal from the electro-optical transmitter to the electro-optical receiver.

\* \* \* \* \*